United States Patent
Liu et al.

(10) Patent No.: US 10,469,049 B2
(45) Date of Patent: Nov. 5, 2019

(54) PIEZOELECTRIC THIN FILM RESONATOR, FILTER, AND DUPLEXER

(71) Applicant: TAIYO YUDEN CO., LTD., Tokyo (JP)

(72) Inventors: Jiansong Liu, Tokyo (JP); Tsuyoshi Yokoyama, Tokyo (JP); Hiroomi Kaneko, Tokyo (JP); Shinji Taniguchi, Tokyo (JP); Tokihiro Nishihara, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 52 days.

(21) Appl. No.: 15/357,540

(22) Filed: Nov. 21, 2016

(65) Prior Publication Data
US 2017/0207768 A1 Jul. 20, 2017

(30) Foreign Application Priority Data

Jan. 14, 2016 (JP) .................................. 2016-005558

(51) Int. Cl.
*H03H 9/02* (2006.01)
*H03H 9/17* (2006.01)
(Continued)

(52) U.S. Cl.
CPC .... *H03H 9/02118* (2013.01); *H03H 9/02015* (2013.01); *H03H 9/173* (2013.01);
(Continued)

(58) Field of Classification Search
CPC ........... H03H 9/02015; H03H 9/02118; H03H 9/173; H03H 9/174; H03H 9/175; H03H 9/564; H03H 9/568; H03H 9/706
(Continued)

(56) References Cited

U.S. PATENT DOCUMENTS 9,048,812 B2   6/2015   Burak et al.
2006/0071736 A1   4/2006   Ruby et al.
(Continued)

FOREIGN PATENT DOCUMENTS

JP   2006-109472 A   4/2006
JP   2007-159123 A   6/2007
(Continued)

OTHER PUBLICATIONS

Japanese Office Action dated Apr. 3, 2018, in a counterpart Japanese patent application No. 2016-005558. (A machine translation (not reviewed for accuracy) attached.).
(Continued)

*Primary Examiner* — Robert J Pascal
*Assistant Examiner* — Jorge L Slazar, Jr.
(74) *Attorney, Agent, or Firm* — Chen Yoshimura LLP

(57) ABSTRACT

A piezoelectric thin film resonator includes: an acoustic reflection layer including an air gap or an acoustic mirror; lower and upper electrodes facing each other in a stacking direction, at least a part of each of the lower and upper electrodes being located on or above the acoustic reflection layer; a piezoelectric film sandwiched between the lower and upper electrodes and including lower and upper piezoelectric films, at least a part of an end face of the piezoelectric film in a film thickness direction being located between outer outlines of the resonance region and the acoustic reflection layer in at least a part of a region surrounding a resonance region; and an insertion film inserted between the lower and upper piezoelectric films, located in at least a part of an outer peripheral region within the resonance region, and not located in a center region of the resonance region.

14 Claims, 20 Drawing Sheets

(51) Int. Cl.
*H03H 9/56* (2006.01)
*H03H 9/70* (2006.01)

(52) U.S. Cl.
CPC ............ *H03H 9/174* (2013.01); *H03H 9/175* (2013.01); *H03H 9/564* (2013.01); *H03H 9/568* (2013.01); *H03H 9/706* (2013.01)

(58) Field of Classification Search
USPC .................................................. 333/133, 187
See application file for complete search history.

(56) References Cited

U.S. PATENT DOCUMENTS

| | | | |
|---|---|---|---|
| 2006/0103492 A1 | 5/2006 | Feng et al. | |
| 2007/0120625 A1 | 5/2007 | Larson et al. | |
| 2007/0279154 A1 | 12/2007 | Taniguchi et al. | |
| 2010/0033063 A1* | 2/2010 | Nishihara | H03H 9/02118 310/365 |
| 2013/0033337 A1 | 2/2013 | Nishihara et al. | |
| 2013/0038405 A1 | 2/2013 | Taniguchi et al. | |
| 2014/0210570 A1 | 7/2014 | Nishihara et al. | |
| 2015/0130559 A1 | 5/2015 | Yokoyama et al. | |
| 2015/0341016 A1 | 11/2015 | Iwaki et al. | |

FOREIGN PATENT DOCUMENTS

| | | |
|---|---|---|
| JP | 2007-324823 A | 12/2007 |
| JP | 2013-038471 A | 2/2013 |
| JP | 2013-38658 A | 2/2013 |
| JP | 2014-161001 A | 9/2014 |
| JP | 2014-207557 A | 10/2014 |
| JP | 2015-095729 A | 5/2015 |
| JP | 2015-220700 A | 12/2015 |

OTHER PUBLICATIONS

Japanese Office Action dated Oct. 2, 2018, in a counterpart Japanese patent application No. 2016-005558. (A machine translation (not reviewed for accuracy) attached.).

* cited by examiner

FIG. 1A
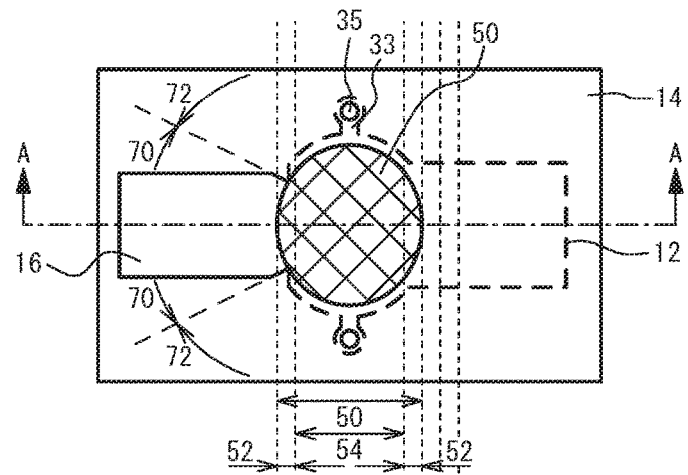
FIG. 1B
FIG. 1C
FIG. 1D
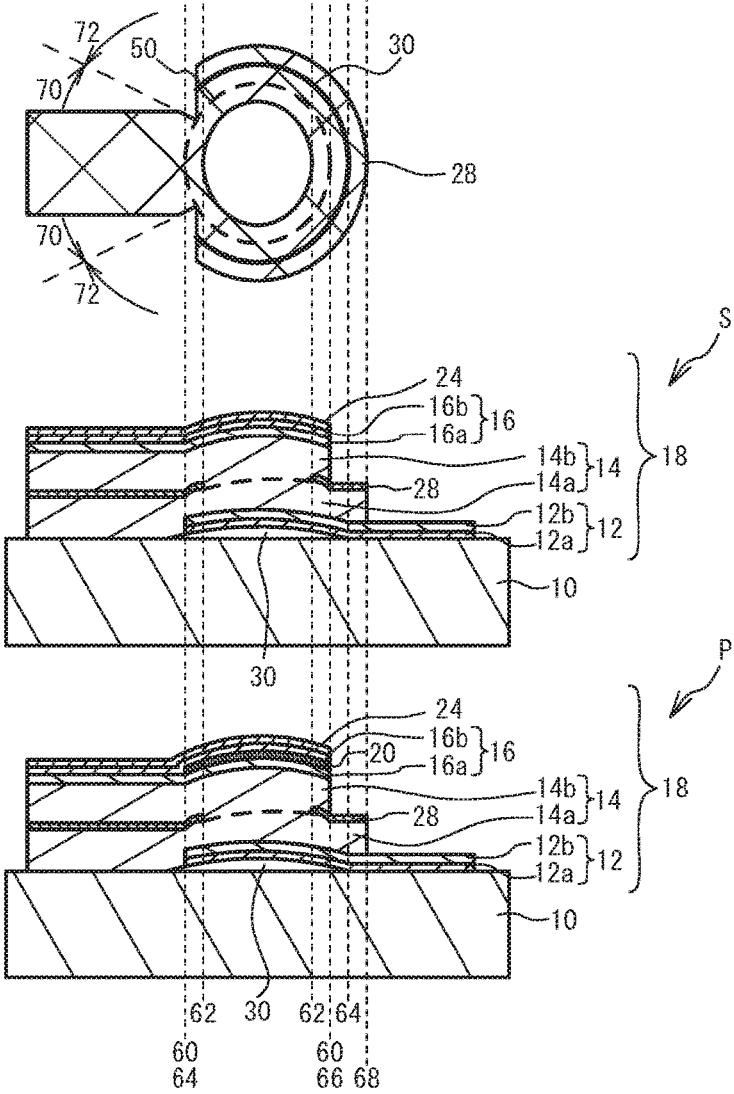

PIEZOELECTRIC THIN FILM RESONATOR, FILTER, AND DUPLEXER

CROSS-REFERENCE TO RELATED APPLICATION

This application is based upon and claims the benefit of priority of the prior Japanese Patent Application No. 2016-005558, filed on Jan. 14, 2016, the entire contents of which are incorporated herein by reference.

FIELD

A certain aspect of the present invention relates to a piezoelectric thin film resonator, a filter, and a duplexer.

BACKGROUND

Acoustic wave devices using piezoelectric thin film resonators are used as filters and duplexers of wireless devices such as, for example, mobile phones. The piezoelectric thin film resonator has a structure designed to have a lower electrode and an upper electrode facing each other across a piezoelectric film. The region where the lower electrode and the upper electrode face each other across the piezoelectric film is a resonance region.

Rapid diffusion of wireless systems has promoted the use of many frequency bands. As a result, filters and duplexers have been required to have steeper skirt characteristics. One way of making the skirt characteristic steeper is to increase the Q-value of the piezoelectric thin film resonator.

Japanese Patent Application Publication No. 2006-109472 (Patent Document 1) discloses a piezoelectric thin film resonator including an anulus located on the surface of one of the upper electrode and the lower electrode. Japanese Patent Application Publication No. 2014-161001 (Patent Document 2) discloses a piezoelectric thin film resonator in which an insertion film is inserted into the piezoelectric film in the outer peripheral region of the resonance region. U.S. Pat. No. 9,048,812 (Patent Document 3) discloses a piezoelectric thin film resonator including an anulus, called a bridge, in the piezoelectric film.

In the piezoelectric thin film resonators disclosed in Patent Documents 1 through 3, the leak of an acoustic wave energy from the resonance region can be reduced, and the Q-value can be improved. However, it is difficult to sufficiently reduce the leak of the acoustic wave energy from the resonance region, and the degree of the improvement of the Q-value is insufficient.

SUMMARY OF THE INVENTION

According to a first aspect of the present invention, there is provided a piezoelectric thin film resonator including: a substrate; an acoustic reflection layer that includes an air gap, or an acoustic mirror in which at least two types of layers with different acoustic characteristics are stacked; a lower electrode and an upper electrode that face each other in a stacking direction, at least a part of the lower electrode and at least a part of the upper electrode being located on or above the acoustic reflection layer; a piezoelectric film that is sandwiched between the lower electrode and the upper electrode and includes a lower piezoelectric film and an upper piezoelectric film, at least a part of an end face of the piezoelectric film in a film thickness direction being located between an outer outline of the resonance region and an outer outline of the acoustic reflection layer in at least a part of a region surrounding a resonance region in which the lower electrode and the upper electrode face each other across the piezoelectric film; and an insertion film that is inserted between the lower piezoelectric film and the upper piezoelectric film, is located in at least a part of an outer peripheral region within the resonance region, and is not located in a center region of the resonance region.

According to a second aspect of the present invention, there is provided a filter including the above piezoelectric thin film resonator.

According to a third aspect of the present invention, there is provided a duplexer including the above filter.

BRIEF DESCRIPTION OF THE DRAWINGS

FIG. 1A is a plan view of a piezoelectric thin film resonator in accordance with a first embodiment, FIG. 1B is a plan view of an insertion film and an air gap, and FIG. 1C and FIG. 1D are cross-sectional views taken along line A-A in FIG. 1A;

DETAILED DESCRIPTION

Figure 2A:
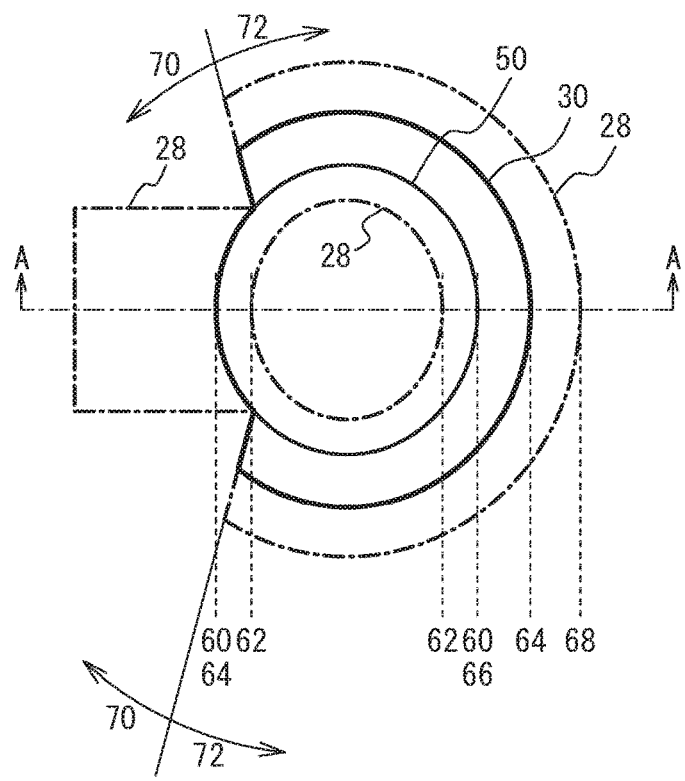
FIG. 2A is a plan view illustrating a positional relationship among the resonance region, the insertion film, the air gap and the piezoelectric film around the resonance region of the piezoelectric thin film resonator of the first embodiment.

Embodiments of the present invention will be described with reference to the accompanying drawings.

First Embodiment

FIG. 1A is a plan view of a piezoelectric thin film resonator in accordance with a first embodiment, FIG. 1B is a plan view of an insertion film and an air gap, and FIG. 1C and FIG. 1D are cross-sectional views taken along line A-A in FIG. 1A. FIG. 1C illustrates a series resonator of, for example, a ladder-type filter, and FIG. 1D illustrates a parallel resonator of, for example, a ladder-type filter.

With reference to FIG. 1A and FIG. 1C, the structure of a series resonator S will be described. A lower electrode 12 is located on a substrate 10 that is a silicon (Si) substrate. An air gap 30 having a dome-shaped bulge is formed between the flat principal surface of the substrate 10 and the lower electrode 12. The dome-shaped bulge is a bulge having a shape in which the height of the air gap 30 is large in the periphery of the air gap 30, and increases at distances closer to the center of the air gap 30, for example. The lower electrode 12 includes a lower layer 12a and an upper layer 12b. The lower layer 12a is made of, for example, a chrome (Cr) film, and the upper layer 12b is made of, for example, a ruthenium (Ru) film.

Located on the lower electrode 12 is a piezoelectric film 14 mainly composed of aluminum nitride (AlN) having a main axis of (002) direction. The piezoelectric film 14 includes a lower piezoelectric film 14a and an upper piezoelectric film 14b. An insertion film 28 is located between the lower and upper piezoelectric films 14a and 14b.

An upper electrode 16 is located on the piezoelectric film 14 so as to have a region (a resonance region 50) in which the upper electrode 16 faces the lower electrode 12 across the piezoelectric film 14. The resonance region 50 has an elliptical shape, and is a region in which the acoustic wave in the thickness extension mode resonates. The upper electrode 16 includes a lower layer 16a and an upper layer 16b. The lower layer 16a is made of, for example, a Ru film, and the upper layer 16b is made of, for example, a Cr film. At least a part of the upper electrode 16 and at least a part of the lower electrode 12 are located on or above the air gap 30, and face each other in a stacking direction.

Formed on the upper electrode 16 is a silicon oxide film as a frequency adjusting film 24. A multilayered film 18 in the resonance region 50 includes the lower electrode 12, the piezoelectric film 14, the upper electrode 16, and the frequency adjusting film 24. The frequency adjusting film 24 may function as a passivation film.

As illustrated in FIG. 1A, an introduction path 33 for etching a sacrifice layer is formed in the lower electrode 12. The sacrifice layer is a layer for forming the air gap 30. The vicinity of the end of the introduction path 33 is not covered with the piezoelectric film 14, and the lower electrode 12 has a hole portion 35 at the end of the introduction path 33.

With reference to FIG. 1D, the structure of a parallel resonator P will be described. The parallel resonator P differs from the series resonator S in that a mass load film 20 made of a titanium (Ti) layer is formed between the lower and upper layers 16a and 16b of the upper electrode 16. Thus, the multilayered film 18 includes the mass load film 20 formed across the entire area in the resonance region 50 in addition to the multilayered film of the series resonator S. Other structures are the same as those of the series resonator S illustrated in FIG. 1C, and thus the description is omitted.

The difference in resonant frequency between the series resonator S and the parallel resonator P is adjusted by using the film thickness of the mass load film 20. The resonant frequency of the series resonator S and the resonant frequency of the parallel resonator P are adjusted by adjusting the film thickness of the corresponding frequency adjusting film 24.

In the present embodiment, a piezoelectric thin film resonator with a resonant frequency of 2 GHz is configured as follows. The lower layer 12a of the lower electrode 12 is made of a Cr film with a film thickness of 100 nm, and the upper layer 12b is made of a Ru film with a film thickness of 200 nm. The piezoelectric film 14 is made of an AlN film with a film thickness of 1200 nm. The insertion film 28 is made of a silicon oxide ($SiO_2$) film with a film thickness of 150 nm. The insertion film 28 is located in the middle of the piezoelectric film 14 in the film thickness direction. The lower layer 16a of the upper electrode 16 is made of a Ru film with a film thickness of 230 nm, and the upper layer 16b is made of a Cr film with a film thickness of 50 nm. The frequency adjusting film 24 is made of a silicon oxide film with a film thickness of 50 nm. The mass load film 20 is made of a Ti film with a film thickness of 120 nm. The film thickness of each layer can be appropriately set so that a desired resonance characteristic is achieved.

As illustrated in FIG. 1B, the insertion film 28 is located in an outer peripheral region 52 within the resonance region 50, and is not located in a center region 54. The outer peripheral region 52 is within the resonance region 50, includes the outer periphery of the resonance region 50, and along the outer periphery. The outer peripheral region 52 has, for example, a strip shape or a ring shape. The center region 54 is within the resonance region 50, and includes the center of the resonance region 50. The center is not necessarily a geometric center.

As disclosed in Patent Document 2, the Young's modulus of the insertion film 28 is preferably less than the Young's modulus of the piezoelectric film 14. When the insertion film 28 and the piezoelectric film 14 have approximately the same density, the acoustic impedance of the insertion film 28 is preferably less than the acoustic impedance of the piezoelectric film 14 because the Young's modulus correlates with the acoustic impedance at the same density. This configuration can improve the Q-value. Furthermore, to make the acoustic impedance of the insertion film 28 less than the acoustic impedance of the piezoelectric film 14, when the piezoelectric film 14 is mainly composed of aluminum nitride, the insertion film 28 is preferably made of an Al film, a gold (Au) film, a copper (Cu) film, a Ti film, a platinum (Pt) film, a tantalum (Ta) film, a Cr film, or a silicon oxide film. Especially, considering the Young's modulus, the insertion film 28 is preferably made of an Al film or a silicon oxide film.

The substrate 10 may be, instead of a Si substrate, a quartz substrate, a glass substrate, a ceramic substrate, or a GaAs substrate. The lower electrode 12 and the upper electrode 16 may be made of a single layer film of Al, Ti, Cu, molybdenum (Mo), tungsten (W), Ta, Pt, rhodium (Rh) or iridium (Ir) instead of Ru and Cr or a multilayered film of at least two of them. For example, the lower layer 16a of the upper electrode 16 may be made of Ru, and the upper layer 16b may be made of Mo.

The piezoelectric film 14 may be made of, instead of aluminum nitride, zinc oxide (ZnO), lead zirconate titanate (PZT), or lead titanate (PbTiO$_3$). Alternatively, for example, the piezoelectric film 14 may be mainly composed of aluminum nitride and may contain other elements to improve the resonance characteristic or to improve the piezoelectricity. For example, the use of scandium (Sc), a divalent element and a quadrivalent element, or a divalent element and a pentavalent element as additive elements improves the piezoelectricity of the piezoelectric film 14. Therefore, the effective electromechanical coupling coefficient of the piezoelectric thin film resonator can be improved. The divalent element is, for example, calcium (Ca), magnesium (Mg), strontium (Sr), or zinc (Zn). The quadrivalent element is, for example, Ti, zirconium (Zr), or hafnium (Hf). The pentavalent element is, for example, Ta, niobium (Nb), or vanadium (V). Furthermore, the piezoelectric film 14 may be mainly composed of aluminum nitride, and may contain boron (B).

The frequency adjusting film 24 may be made of, instead of a silicon oxide film, a silicon nitride film or an aluminum nitride film. The mass load film 20 may be made of a single-layer film of Ru, Cr, Al, Cu, Mo, W, Ta, Pt, Rh, or Ir instead of Ti. Alternatively, the mass load film 20 may be made of an insulating film made of, for example, metal nitride such as silicon nitride, or metal oxide such as silicon oxide. The mass load film 20 may be formed under the lower electrode 12, between the layers of the lower electrode 12, on the upper electrode 16, between the lower electrode 12 and the piezoelectric film 14, or between the piezoelectric film 14 and the upper electrode 16 instead of between the layers of the upper electrode 16 (between the lower and upper layers 16a and 16b). The mass load film 20 may be larger than the resonance region 50 as long as the mass load film 20 is formed so as to include the resonance region 50.

Figure 2B:
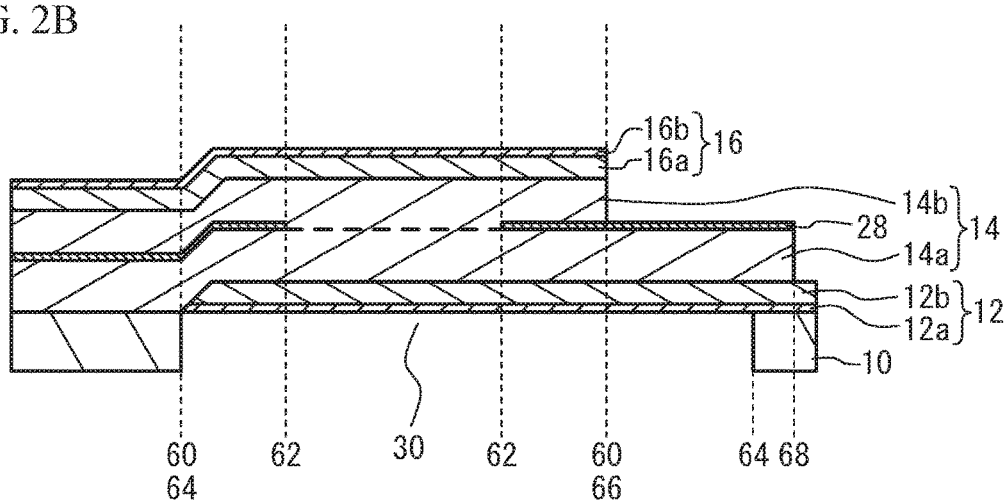
FIG. 2B is a cross-sectional view taken along line A-A in FIG. 2A.

FIG. 2A is a plan view illustrating a positional relationship among the resonance region, the insertion film, the air gap, and the piezoelectric film around the resonance region of the piezoelectric thin film resonator of the first embodiment, and FIG. 2B is a cross-sectional view taken along line A-A in FIG. 2A. Although the air gap 30 is dome-shaped, FIG. 2B simplifies the illustration of the upper surface of the air gap 30 and illustrates the upper surface of the air gap 30 as a flat surface. For convenience sake, the ratio in length in FIG. 2B does not necessarily correspond to the ratio in length in FIG. 2A. The same applies to the drawings hereinafter.

FIG. 1A through FIG. 2B illustrate an outer outline 60 that is the outer outline of the resonance region 50, an inner outline 62 that is the inner outline of the insertion film 28, an outer outline 64 of the air gap 30, an outer outline 66 of the upper piezoelectric film 14b, and an outer outline 68 of the lower piezoelectric film 14a. In a region surrounding the resonance region 50, illustrated are an extraction region 70 in which the upper electrode 16 is extracted from the resonance region 50, and a region 72 other than the extraction region 70 in the region surrounding the resonance region 50.

In each film, when the end face is tilted or curved in the film thickness direction, the outer outline corresponds to the outermost part of the tilted or curved end face, and the inner outline corresponds to the innermost part of the tilted or curved end face. As long as at least a part of the tilted or curved end face substantially coincides with the outline, it may be said that the end face substantially coincides with the outline. As long as at least a part of the tilted or curved end face is located further out than (or further in than) the outline, it may be said that the end face is located further out than (or further in than) the outline. The term "substantially coincide with" means that two things coincide with each other to the extent of, for example, variations in the fabrication process or alignment accuracy in the fabrication process.

In the extraction region 70, the outer outline of the lower electrode 12 forms the outer outline 60 of the resonance region 50. In the region 72, the outer outline of the upper electrode 16 forms the outer outline 60 of the resonance region 50. In the extraction region 70, the outer outline 60 of the resonance region 50 substantially coincides with the outer outline 64 of the air gap 30. In the region 72, the outer outline 64 of the air gap 30 is located further out than the outer outline 60 of the resonance region 50. The inner outline 62 of the insertion film 28 is located further in than the outer outline 60 of the resonance region 50. In plan view, the upper piezoelectric film 14b overlaps the upper electrode 16, and has the same shape as the upper electrode 16. That is, in the region 72, the outer outline 66 of the upper piezoelectric film 14b substantially coincides with the outer outline 60 of the resonance region 50. In plan view, the lower piezoelectric film 14a overlaps the insertion film 28, and has the same shape as the insertion film 28. In the region 72, the outer outline 68 of the lower piezoelectric film 14a is located further out than the outer outline 64 of the air gap 30. In the extraction region 70, the outer outline 68 of the lower piezoelectric film 14a substantially coincides with the outer outline 66 of the upper piezoelectric film 14b.

Figure 3A:
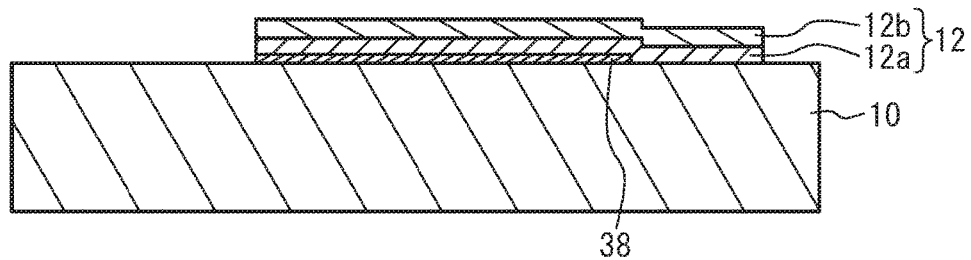
FIG. 3A through FIG. 3C are cross-sectional views (No. 1) illustrating a method of fabricating a series resonator of the first embodiment.

FIG. 3A through FIG. 4B are cross-sectional views illustrating a method of fabricating the series resonator of the first embodiment. As illustrated in FIG. 3A, a sacrifice layer 38 for forming an air gap is formed on the substrate 10 having a flat principal surface. The sacrifice layer 38 has a film thickness of, for example, 10 to 100 nm. The material of the sacrifice layer 38 is selected from substances such as magnesium oxide (MgO), ZnO, germanium (Ge), or silicon oxide (SiO$_2$) that can easily dissolve in an etching liquid or an etching gas. Then, the sacrifice layer 38 is patterned into a desired shape by photolithography and etching. The shape of the sacrifice layer 38 corresponds to the planer shape of the air gap 30, and includes a region to be, for example, the resonance region 50. Then, formed on the sacrifice layer 38 and the substrate 10 are the lower layer 12a and the upper layer 12b as the lower electrode 12. The sacrifice layer 38 and the lower electrode 12 are formed by, for example, sputtering, vacuum evaporation, or Chemical Vapor Deposition (CVD). Then, the lower electrode 12 is patterned into a desired shape by photolithography and etching. The lower electrode 12 may be formed by liftoff.

Figure 3B:
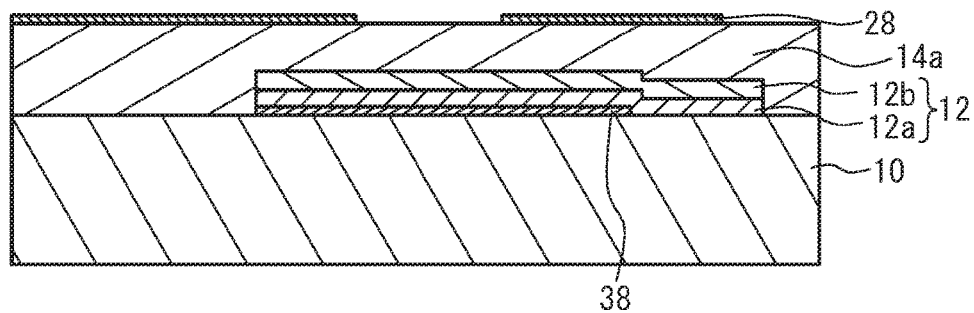

As illustrated in FIG. 3B, the lower piezoelectric film 14a is formed on the lower electrode 12 and the substrate 10 by, for example, sputtering, vacuum evaporation, or CVD. The insertion film 28 is formed on the lower piezoelectric film 14a by, for example, sputtering, vacuum evaporation, or CVD. Then, the insertion film 28 is patterned into a desired shape by photolithography and etching. The insertion film 28 may be formed by liftoff.

Figure 3C:
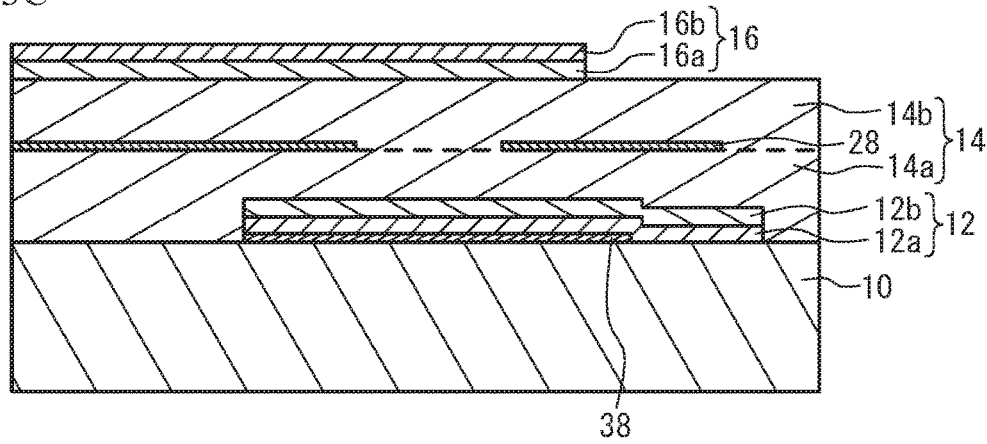

As illustrated in FIG. 3C, the upper piezoelectric film 14b and the lower and upper layers 16a and 16b of the upper electrode 16 are formed by, for example, sputtering, vacuum evaporation, or CVD. The lower and upper piezoelectric films 14a and 14b form the piezoelectric film 14. The upper electrode 16 is patterned into a desired shape by photolithography and etching. The upper electrode 16 may be formed by liftoff.

In the parallel resonator illustrated in FIG. 1D, after the lower layer 16a of the upper electrode 16 is formed, the mass load film 20 is formed by, for example, sputtering, vacuum evaporation, or CVD. The mass load film 20 is patterned into a desired shape by photolithography and etching. Then, the upper layer 16b of the upper electrode 16 is formed.

The frequency adjusting film 24 is formed by, for example, sputtering or CVD. The frequency adjusting film 24 is patterned into a desired shape by photolithography and etching.

Figure 4A:
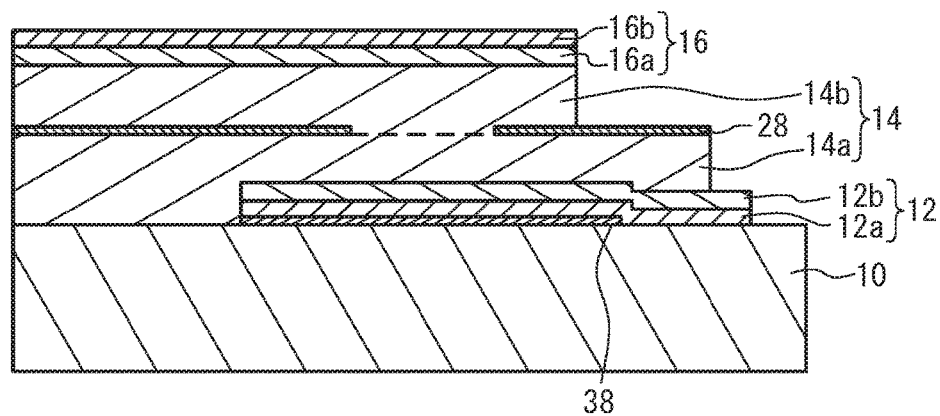
FIG. 4A and FIG. 4B are cross-sectional views (No. 2) illustrating the method of fabricating the series resonator of the first embodiment.

As illustrated in FIG. 4A, the piezoelectric film 14 is patterned into a desired shape by photolithography and etching. As an etching technique, wet etching may be used or dry etching may be used. The upper electrode 16 may be used as at least a part of a mask for etching the upper piezoelectric film 14b. When the upper piezoelectric film 14b is etched by using the upper electrode 16 as a mask, the upper piezoelectric film 14b and the upper electrode 16 can be patterned into the same shape. The insertion film 28 and the upper electrode 16 may be used as at least a part of a mask for etching the lower piezoelectric film 14a. When the lower piezoelectric film 14a is etched by using the insertion film 28 as a mask, the outline of the lower piezoelectric film 14a and the outline of the insertion film 28 can be made to coincide with each other. Side etching by wet etching allows the outer outline 66 of the upper piezoelectric film 14b to be formed further in than the outline of the upper electrode 16. In addition, the outer outline of the lower piezoelectric film 14a can be formed further in than the outer outline of the insertion film 28.

Figure 4B:
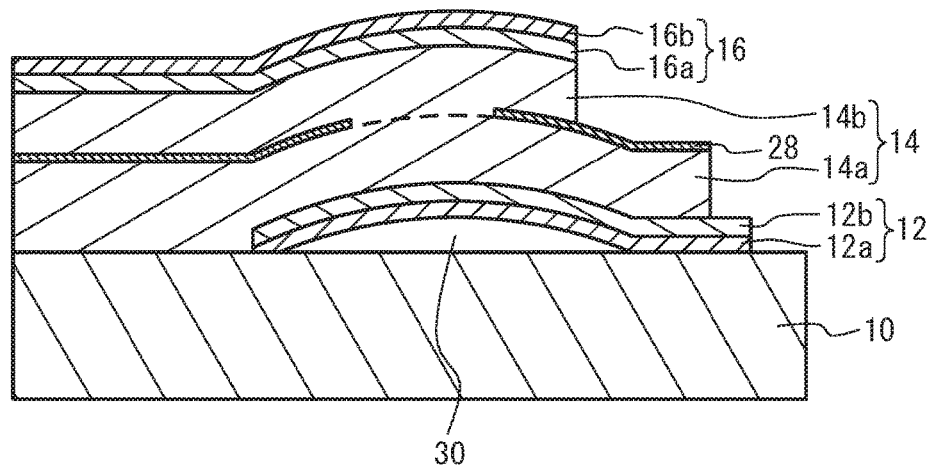

As illustrated in FIG. 4B, an etching liquid for etching the sacrifice layer 38 is introduced into the sacrifice layer 38 under the lower electrode 12 through the hole portion 35 and the introduction path 33 (see FIG. 1A). This process removes the sacrifice layer 38. A substance for etching the sacrifice layer 38 is preferably a substance that does not etch materials composing the resonator except the sacrifice layer 38. Especially, the substance for etching is preferably a substance that does not etch the lower electrode 12 with which the substance for etching comes in contact. The stress of the multilayered film 18 (see FIG. 1C and FIG. 1D) is set to a compression stress. This setting allows the multilayered film 18 to bulge out to the opposite side from the substrate 10 so as to separate from the substrate 10 when the sacrifice layer 38 is removed. The air gap 30 having a dome-shaped bulge is formed between the lower electrode 12 and the substrate 10. The above process completes the series resonator S illustrated in FIG. 1A and FIG. 1C and the parallel resonator P illustrated in FIG. 1A and FIG. 1D.

In the first embodiment, in the region 72 that is a part of the region surrounding the resonance region 50, the outer outline 64 of the air gap 30 is located further out than the outer outline 60 of the resonance region 50. At least a part of the end face of the piezoelectric film 14 in the film thickness direction is located between the outer outline 60 of the resonance region 50 and the outer outline 64 of the air gap 30 in plan view. That is, at least a part of the end face of the piezoelectric film 14 substantially coincides with the outer outline 60 of the resonance region 50 or is located further out than the outer outline of the resonance region 50. Moreover, at least a part of the end face of the piezoelectric film 14 substantially coincides with the outer outline 64 of the air gap 30, or is located further out than the outer outline 64 of the air gap 30. As described above, the configuration in which a part of the end face of the piezoelectric film 14 is located between the outer outline 60 of the resonance region 50 and the outer outline 64 of the air gap 30 causes the acoustic wave leaking from the resonance region 50 to be reflected or attenuated. Accordingly, the loss of the acoustic wave energy is reduced, and the Q-value improves.

Figure 5A:
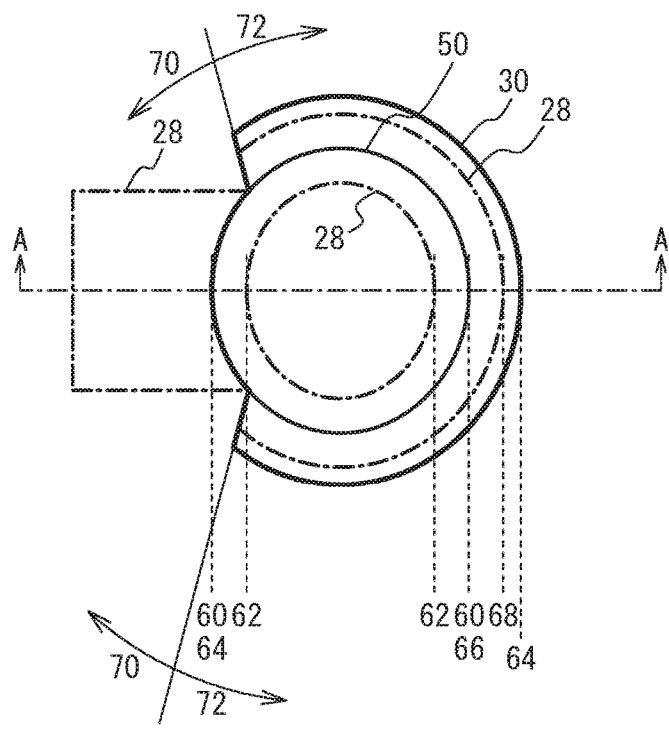
FIG. 5A is a plan view illustrating a positional relationship among the resonance region, the insertion film, the air gap, and the piezoelectric film around the resonance region of a piezoelectric thin film resonator in accordance with a first variation of the first embodiment.
Figure 5B:
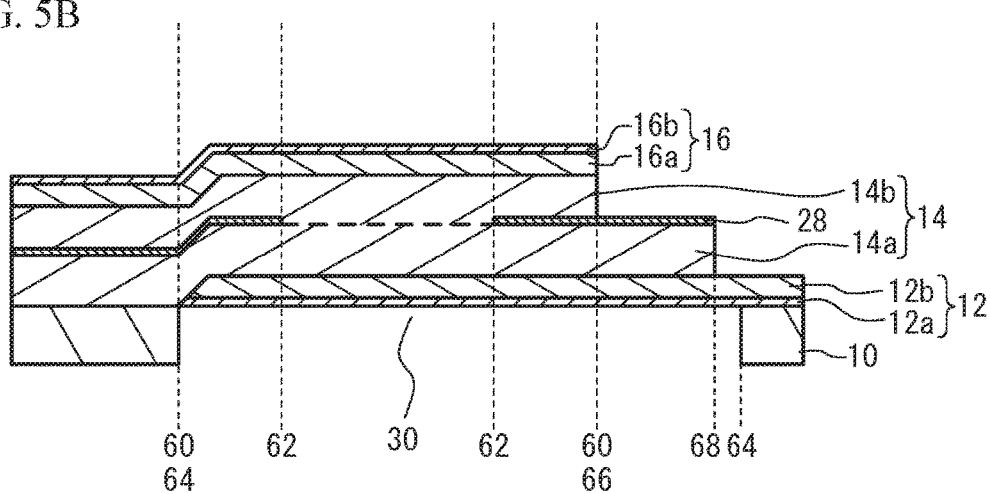
FIG. 5B is a cross-sectional view taken along line A-A in FIG. 5A.

FIG. 5A is a plan view illustrating a positional relationship among the resonance region, the insertion film, the air gap, and the piezoelectric film around the resonance region of a piezoelectric thin film resonator in accordance with a first variation of the first embodiment, and FIG. 5B is a cross-sectional view taken along line A-A in FIG. 5A. As illustrated in FIG. 5A and FIG. 5B, in the region 72 other than the extraction region 70, the outer outline 68 of the lower piezoelectric film 14a is located further out than the outer outline 60 of the resonance region 50 and further in than the outer outline 64 of the air gap 30. Other configurations are the same as those of the first embodiment, and the description is thus omitted.

Figure 6A:
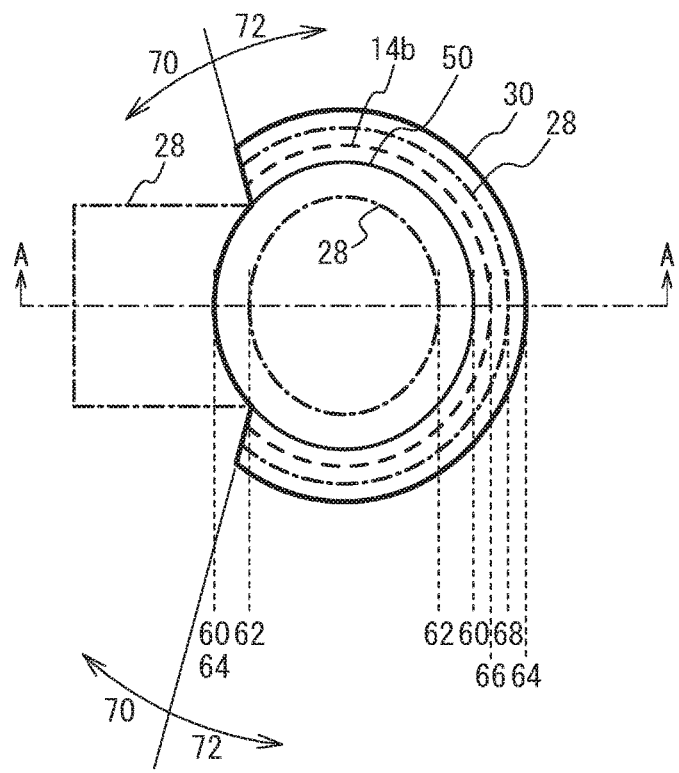
FIG. 6A is a plan view illustrating a positional relationship among the resonance region, the insertion film, the air gap, and the piezoelectric film around the resonance region of a piezoelectric thin film resonator in accordance with a second variation of the first embodiment.
Figure 6B:
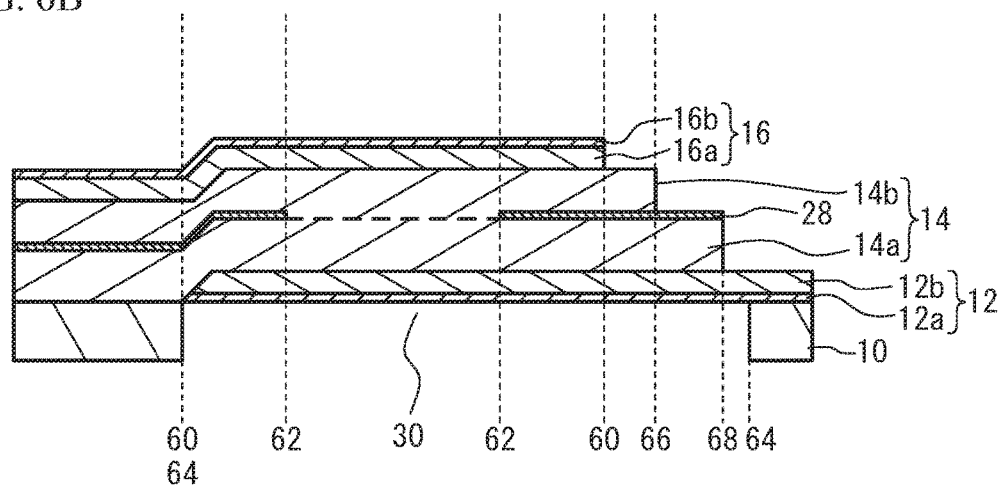
FIG. 6B is a cross-sectional view taken along line A-A in FIG. 6A.

FIG. 6A is a plan view illustrating a positional relationship among the resonance region, the insertion film, the air gap, and the piezoelectric film around the resonance region of a piezoelectric thin film resonator in accordance with a second variation of the first embodiment, and FIG. 6B is a cross-sectional view taken along line A-A in FIG. 6A. As illustrated in FIG. 6A and FIG. 6B, in the region 72 other than the extraction region 70, the outer outline 66 of the upper piezoelectric film 14b is located further out than the outer outline 60 of the resonance region 50 and further in than the outer outline 68 of the lower piezoelectric film 14a. Other configurations are the same as those of the first variation of the first embodiment, and the description is thus omitted.

Figure 7A:
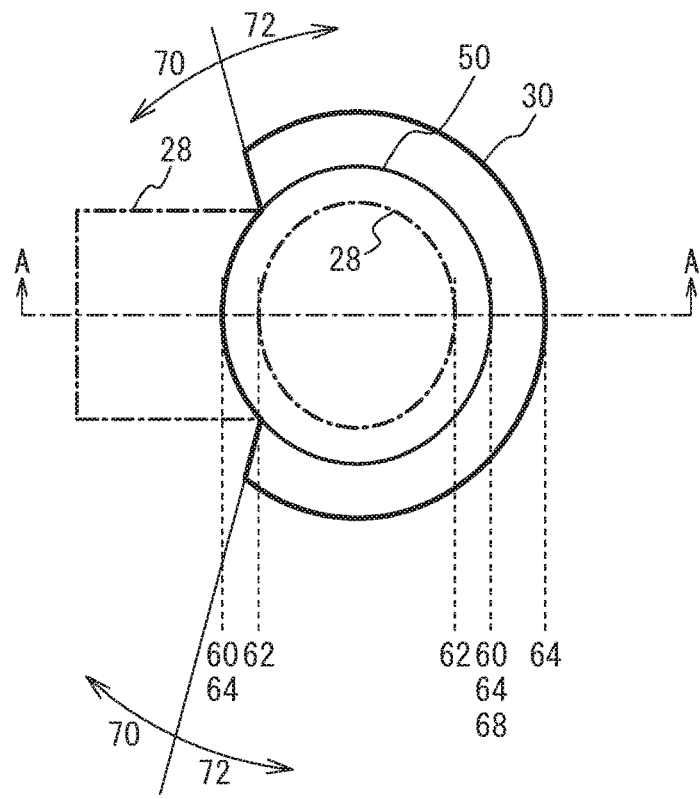
FIG. 7A is a plan view illustrating a positional relationship among the resonance region, the insertion film, the air gap, and the piezoelectric film around the resonance region of a piezoelectric thin film resonator in accordance with a third variation of the first embodiment.
Figure 7B:
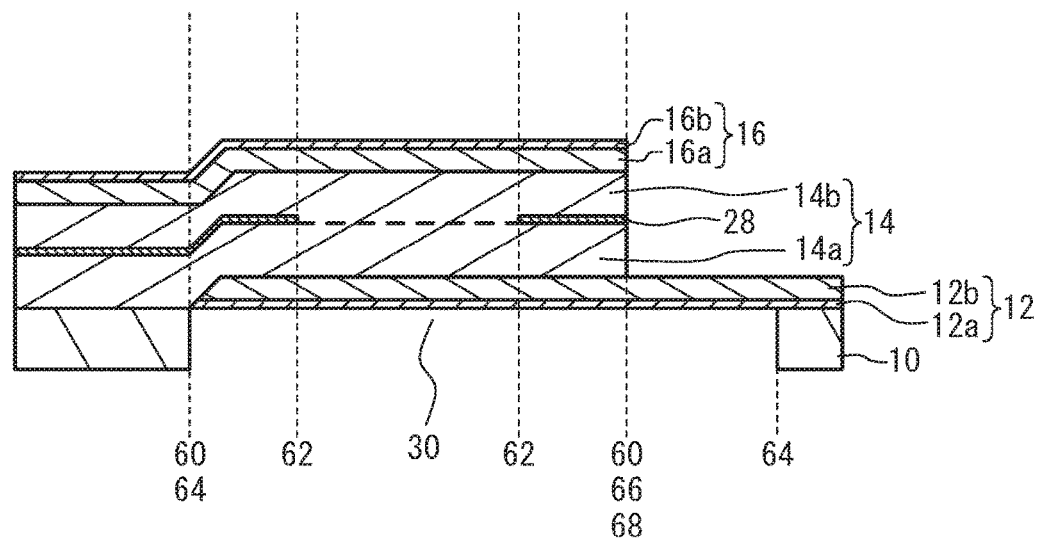
FIG. 7B is a cross-sectional view taken along line A-A in FIG. 7A.

FIG. 7A is a plan view illustrating a positional relationship among the resonance region, the insertion film, the air gap, and the piezoelectric film around the resonance region of a piezoelectric thin film resonator in accordance with a third variation of the first embodiment, and FIG. 7B is a cross-sectional view taken along line A-A in FIG. 7A. As illustrated in FIG. 7A and FIG. 7B, in the region 72 other than the extraction region 70, the outer outline 68 of the lower piezoelectric film 14a and the outer outline 66 of the upper piezoelectric film 14b substantially coincide with the outer outline 60 of the resonance region 50. Other configurations are the same as those of the first embodiment, and the description is thus omitted.

Figure 8A:
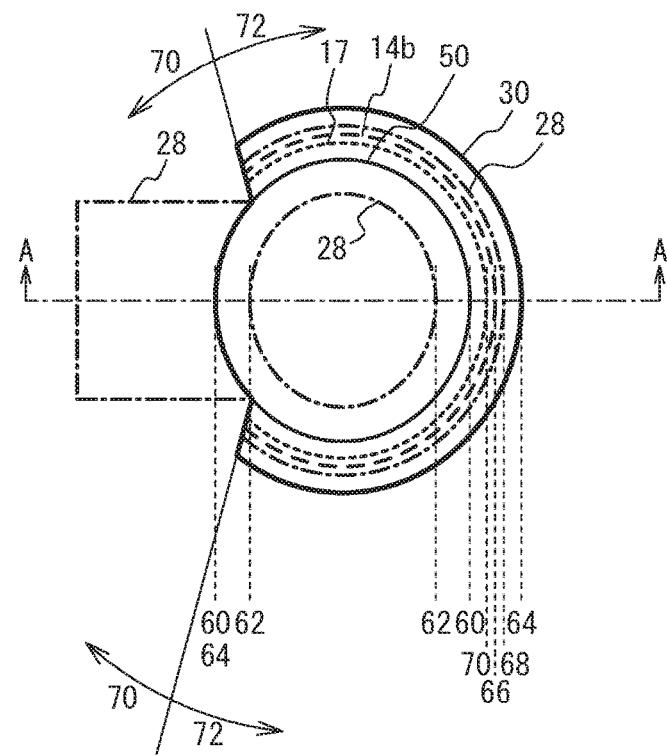
FIG. 8A is a plan view illustrating a positional relationship among the resonance region, the insertion film, the air gap, and the piezoelectric film around the resonance region of a piezoelectric thin film resonator in accordance with a fourth variation of the first embodiment.
Figure 8B:
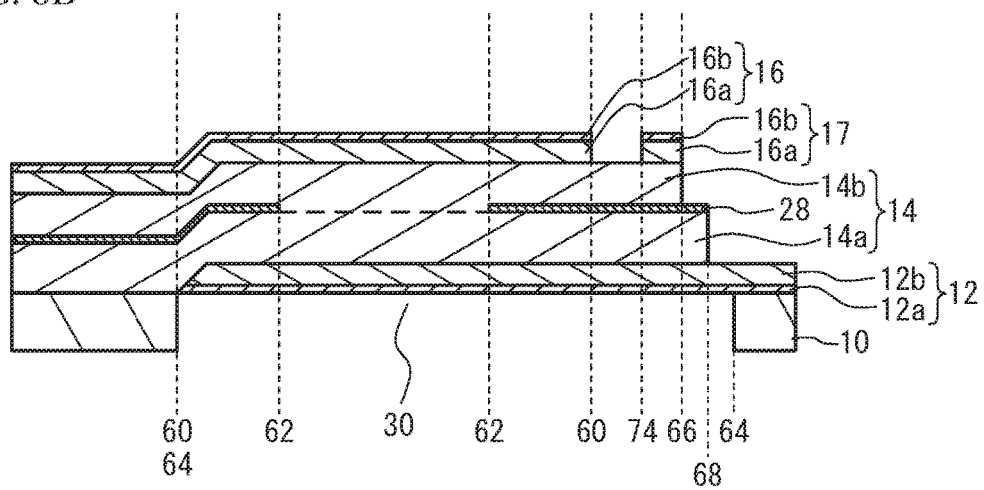
FIG. 8B is a cross-sectional view taken along line A-A in FIG. 8A.

FIG. 8A is a plan view illustrating a positional relationship among the resonance region, the insertion film, the air gap, and the piezoelectric film around the resonance region of a piezoelectric thin film resonator in accordance with a fourth variation of the first embodiment, and FIG. 8B is a cross-sectional view taken along line A-A in FIG. 8A. As illustrated in FIG. 8A and FIG. 8B, in the region 72 other than the extraction region 70, an additional film 17 is located on the upper piezoelectric film 14b inside the outer outline 66 of the upper piezoelectric film 14b. The additional film 17 is formed of the lower and upper layers 16a and 16b that form the upper electrode 16. The outer outline of the additional film 17 substantially coincides with the outer outline 66 of the upper piezoelectric film 14b. An inner outline 74 of the additional film 17 is located further out than the outer outline 60 of the resonance region 50. This configuration makes the additional film 17 away from the upper electrode 16. Other configurations are the same as those of the second variation of the first embodiment, and thus the description is omitted.

The additional film 17 functions as an etching stopper when the piezoelectric film 14 is etched. For example, in the second variation of the first embodiment, the alignment accuracy between the outer outline 66 of the upper piezoelectric film 14b and the outer outline 60 of the resonance region 50 is affected by the alignment accuracy of a mask in photolithography. In contrast, the fourth variation of the first embodiment can use the additional film 17 as a mask when the upper piezoelectric film 14b is etched, and thus can precisely form the outer outline 66 of the upper piezoelectric film 14b. In addition, the additional film 17 shares at least one of the layers of the upper electrode 16. This configuration simplifies the fabrication process.

Figure 9A:
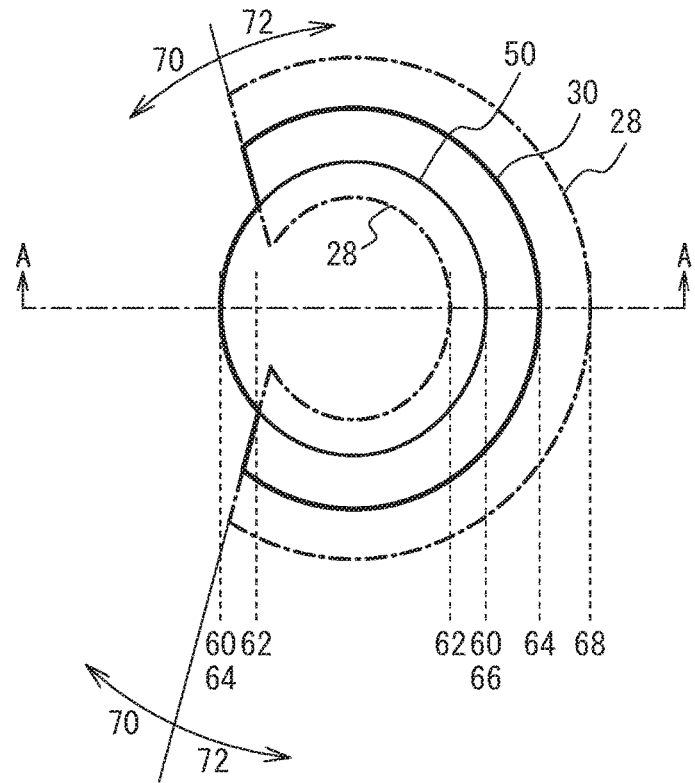
FIG. 9A is a plan view illustrating a positional relationship among the resonance region, the insertion film, the air gap, and the piezoelectric film around the resonance region of a piezoelectric thin film resonator in accordance with a fifth variation of the first embodiment.
Figure 9B:
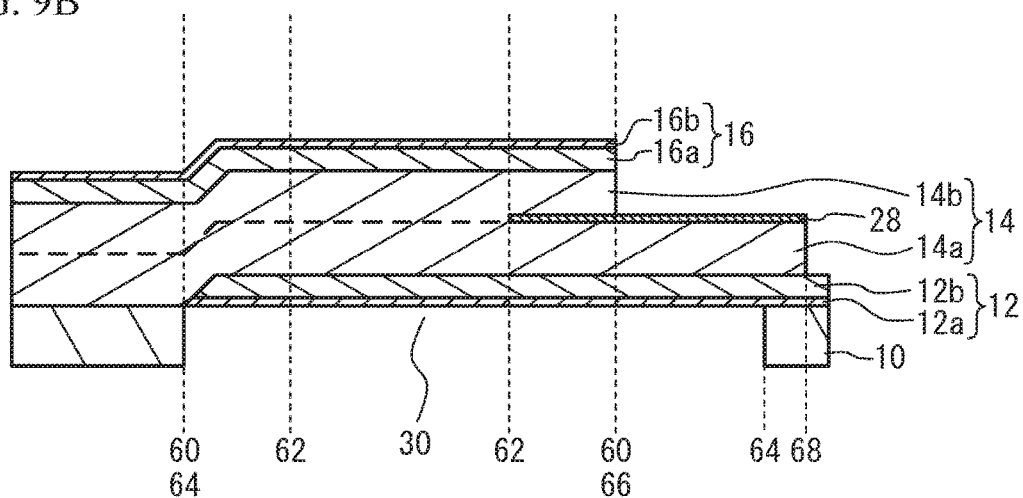
FIG. 9B is a cross-sectional view taken along line A-A in FIG. 9A.

FIG. 9A is a plan view illustrating a positional relationship among the resonance region, the insertion film, the air gap, and the piezoelectric film around the resonance region of a piezoelectric thin film resonator in accordance with a fifth variation of the first embodiment, and FIG. 9B is a cross-sectional view taken along line A-A in FIG. 9A. As illustrated in FIG. 9A and FIG. 9B, in the extraction region 70, the insertion film 28 is not formed. Other configurations are the same as those of the first embodiment, and the description is thus omitted.

Figure 10A:
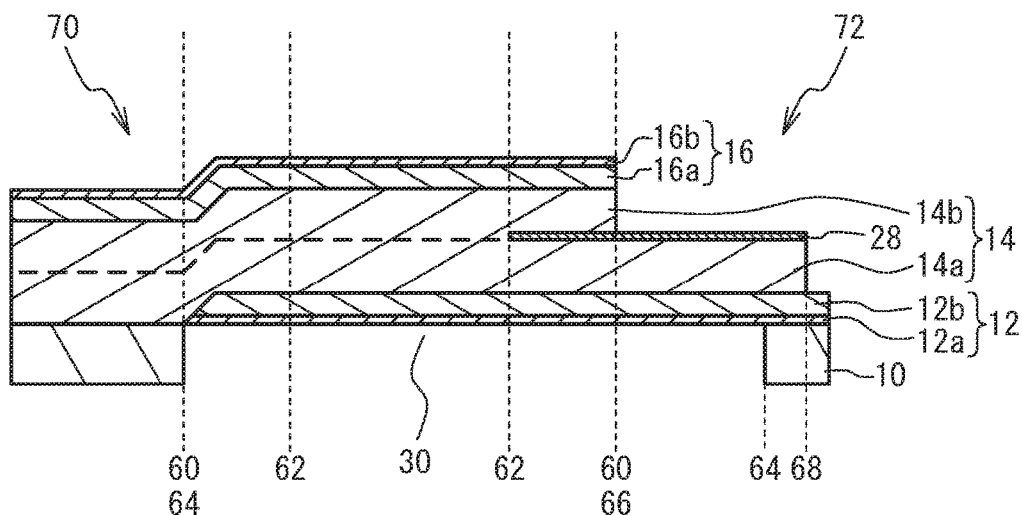
FIG. 10A and FIG. 10B are cross-sectional views of piezoelectric thin film resonators in accordance with sixth and seventh variations of the first embodiment, respectively.
Figure 10B:
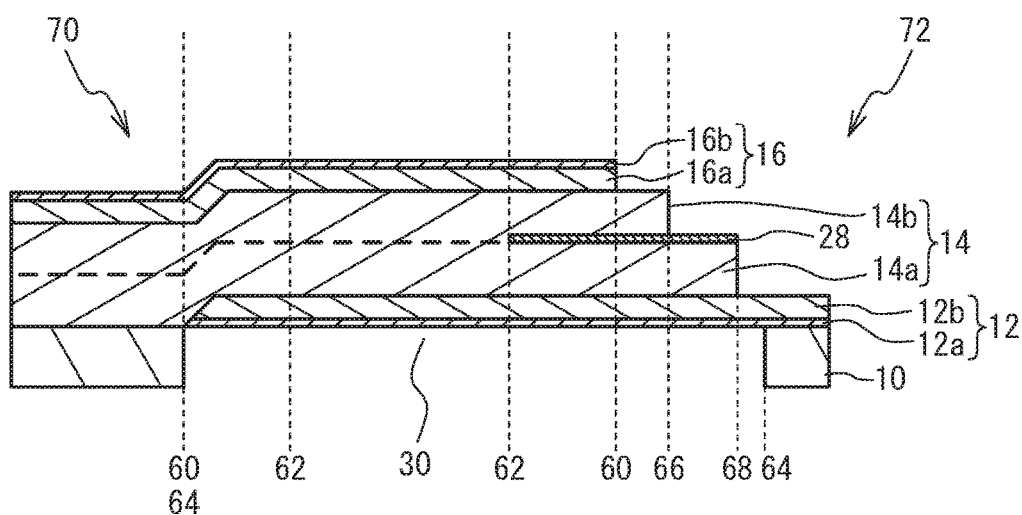

FIG. 10A and FIG. 10B are cross-sectional views of piezoelectric thin film resonators in accordance with sixth and seventh variations of the first embodiment, respectively. As illustrated in FIG. 10A and FIG. 10B, in the extraction region 70, the insertion film 28 is not formed. Other configurations are the same as those of the first and second variations of the first embodiment, and thus the description is omitted.

Figure 11A:
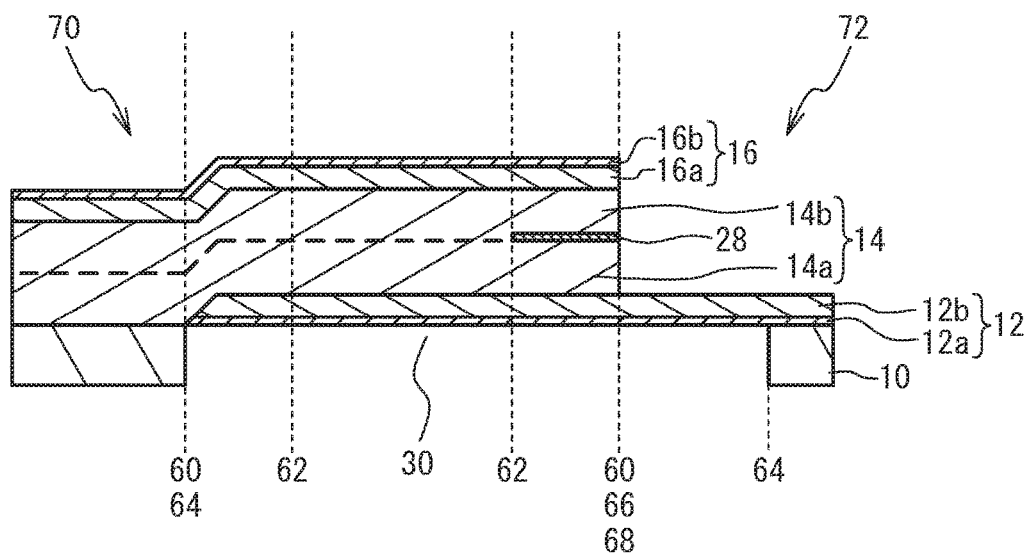
FIG. 11A and FIG. 11B are cross-sectional views of piezoelectric thin film resonators in accordance with eighth and ninth variations of the first embodiment, respectively.
Figure 11B:
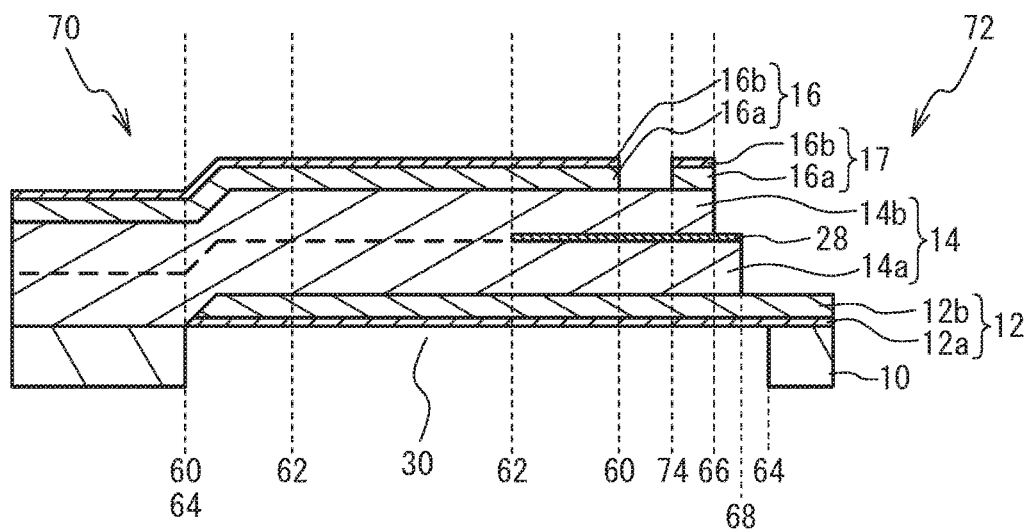

FIG. 11A and FIG. 11B are cross-sectional views of piezoelectric thin film resonators in accordance with eighth and ninth variations of the first embodiment, respectively. As illustrated in FIG. 11A and FIG. 11B, in the extraction region 70, the insertion film 28 is not formed. Other configurations are the same as those of the third and fourth variations of the first embodiment, and thus the description is omitted.

As described in the first embodiment and the first through fourth variations thereof, the insertion film 28 may be formed so as to completely surround the resonance region 50. As described in the fifth through ninth variations of the first embodiment, the insertion film 28 may be formed in a part of the region surrounding the resonance region 50.

Second Embodiment

Figure 12A:
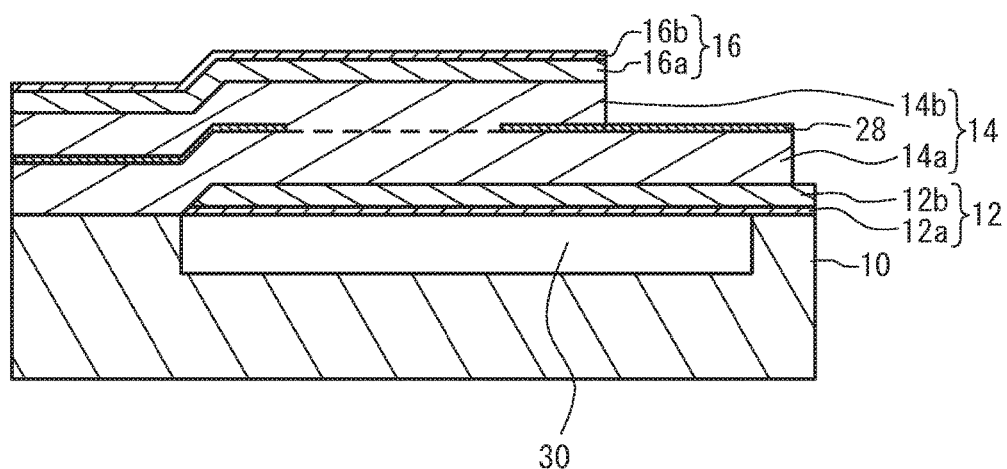
FIG. 12A is a cross-sectional view of a piezoelectric thin film resonator in accordance with a second embodiment.
Figure 12B:
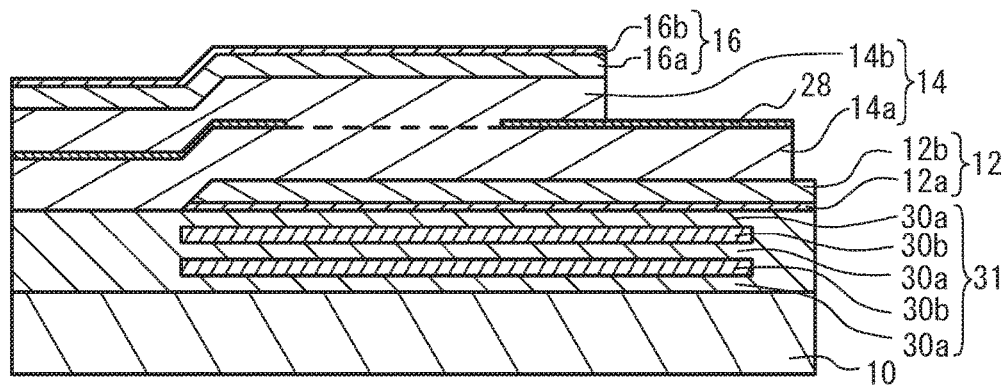
FIG. 12B is a cross-sectional view of a piezoelectric thin film resonator in accordance with a first variation of the second embodiment.

A second embodiment and a variation thereof changes the structure of the air gap. FIG. 12A is a cross-sectional view of a piezoelectric thin film resonator of the second embodiment, and FIG. 12B is a cross-sectional view of a piezoelectric thin film resonator of a first variation of the second embodiment. As illustrated in FIG. 12A, a recess is formed in the upper surface of the substrate 10. The lower electrode 12 is flatly formed on the substrate 10. Accordingly, the air gap 30 is formed in the recess of the substrate 10. The air gap 30 is formed so as to include the resonance region 50. Other configurations are the same as those of the first embodiment, and the description is thus omitted. The air gap 30 may be formed so as to penetrate through the substrate 10. An insulating film making contact with the lower surface of the lower electrode 12 may be formed. That is, the air gap 30 may be formed between the substrate 10 and an insulating film making contact with the lower electrode 12. The insulating film may be made of, for example, an aluminum nitride film.

As illustrated in FIG. 12B, an acoustic mirror 31 is formed under the lower electrode 12 of the resonance region 50. The acoustic mirror 31 includes films 30a with a low acoustic impedance and films 30b with a high acoustic impedance alternately stacked. Each of the films 30a and 30b has a film thickness of, for example, $\lambda/4$ ($\lambda$ is the wavelength of the acoustic wave). The stacking number of the films 30a and 30b can be freely selected. It is only required that the acoustic mirror 31 is formed of at least two types of layers with different acoustic characteristics staked at intervals. The substrate 10 may be one of at least two types of layers with different acoustic characteristics of the acoustic mirror 31. For example, the acoustic mirror 31 may have a structure in which one film with an acoustic impedance different from the acoustic impedance of the substrate 10 is located in the substrate 10. Other configurations are the same as those of the first embodiment, and the description is thus omitted.

In the first embodiment and the variations thereof, the air gap 30 may be formed as in the second embodiment, or the acoustic mirror 31 may be formed instead of the air gap 30 as in the first variation of the second embodiment.

As described in the first embodiment, the variations thereof, and the second embodiment, the piezoelectric thin film resonator may be a Film Bulk Acoustic Resonator (FBAR) in which the air gap 30 is formed between the substrate 10 and the lower electrode 12 in the resonance region 50. Alternately, as described in the first variation of the second embodiment, the piezoelectric thin film resonator may be a Solidly Mounted Resonator (SMR) that includes the acoustic mirror 31, which reflects the acoustic wave propagating through the piezoelectric film 14, under the lower electrode 12 in the resonance region 50.

The first and second embodiments and the variations thereof have described exemplary cases in which in the extraction region 70, the outer outline 64 of the air gap 30 or the outer outline 64 of the acoustic mirror 31 substantially coincides with the outer outline 60 of the resonance region 50. However, the outer outline 64 of the air gap 30 or the outer outline 64 of the acoustic mirror 31 may be located further out than the outer outline 60 of the resonance region 50. In addition, exemplary cases in which in the region 72 other than the extraction region 70, at least a part of the piezoelectric film 14 is located between the outer outline 60 of the resonance region 50 and the outer outline 64 of the air gap 30 or the outer outline 64 of the acoustic mirror 31 have been described. However, it is only required that in at least a part of the region surrounding the resonance region 50, at least a part of the end face of the piezoelectric film 14 is located between the outer outline 60 of the resonance region 50 and the outer outline 64 of the air gap 30 or the outer outline 64 of the acoustic mirror 31. Furthermore, exemplary cases where the resonance region 50 has an elliptical shape have been described, but the resonance region 50 may have other shapes. For example, the resonance region 50 may have a polygonal shape such as a quadrangle shape or a pentagonal shape.

In the first embodiment and the variations thereof, the effect of the position of the outer outline of the piezoelectric film 14 on the resonance characteristic was simulated by a two-dimensional finite element method. The material and the film thickness of each film used for the simulation are as follows.

Lower layer 12a of the lower electrode 12: Cr film with a film thickness of 100 nm
Upper layer 12b of the lower electrode 12: Ru film with a film thickness of 200 nm
Piezoelectric film 14: AlN film with a film thickness of 1260 nm
Lower piezoelectric film 14a: AlN film with a film thickness of 630 nm
Upper piezoelectric film 14b: AlN film with a film thickness of 630 nm
Insertion film 28: Silicon oxide film with a film thickness of 150 nm
Lower layer 16a of the upper electrode 16: Ru film with a film thickness of 230 nm
Upper layer 16b of the upper electrode 16: Cr film with a film thickness of 35 nm
Width W0 of the resonance region 50: 84 μm
Insertion width W2 of the insertion film 28: 2.8 μm
Distance W4 between the air gap 30 and the resonance region 50: 13 μm
Distance W6: 2 μm
Distance W8: 8 μm The simulation was conducted on samples a through d, E, and e representing comparative examples, and samples A through D representing the embodiment. The samples A through E are examples in which the insertion film 28 is located in the piezoelectric film 14, and the samples a through e are examples in which the insertion film 28 is not located. The samples E and e are examples in which the end face of the piezoelectric film 14 overlaps the air gap 30 in plan view. The samples A through D and a through d are examples in which at least a part of the end face of the piezoelectric film 14 overlaps the air gap 30 in plan view.

Figure 13A:
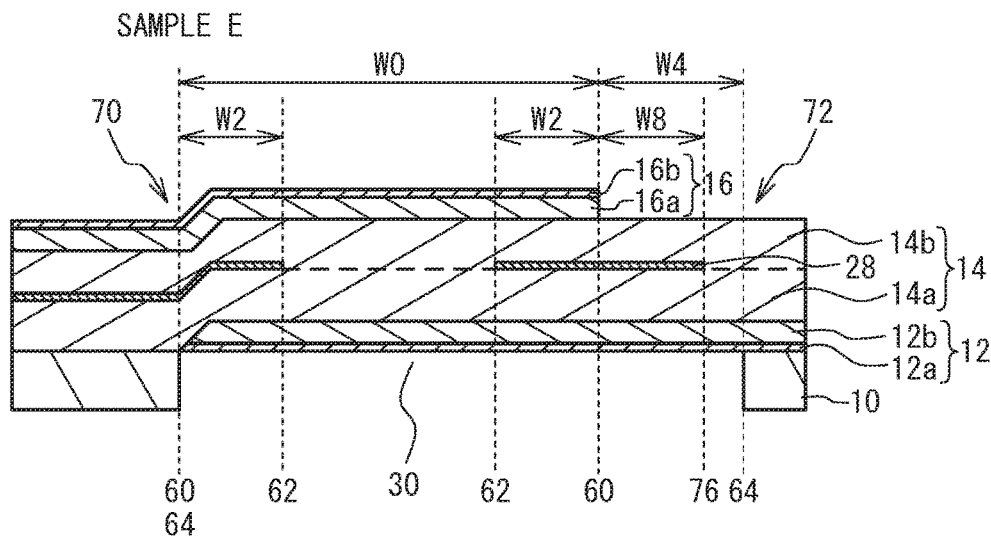
FIG. 13A and FIG. 13B are cross-sectional views of samples E and e as comparative examples, respectively.
Figure 13B:
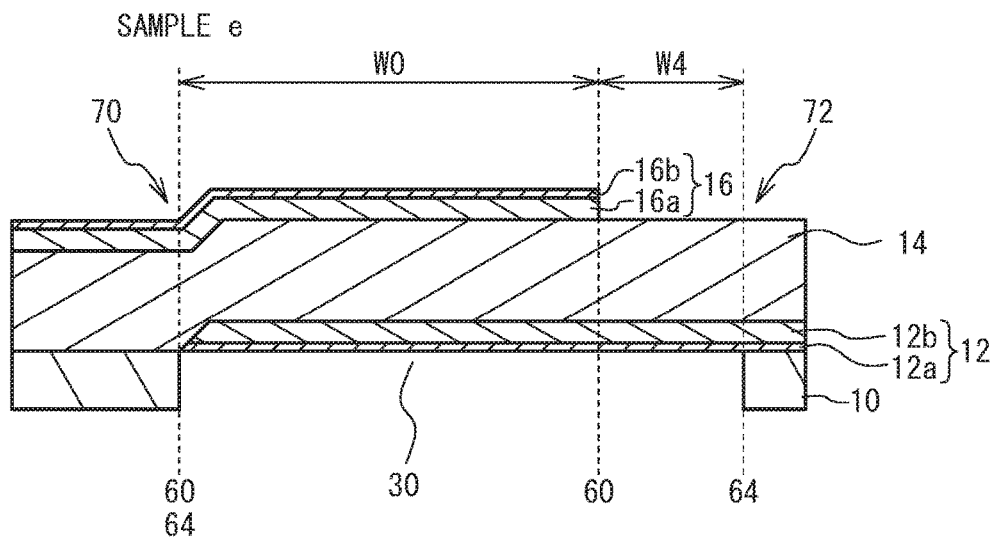

FIG. 13A and FIG. 13B are cross-sectional views of the samples E and e as the comparative examples, respectively. As illustrated in FIG. 13A, in the extraction region 70 of the upper electrode 16, the outer outline 60 of the resonance region 50 coincides with the outer outline 64 of the air gap 30. In the region 72 other than the extraction region 70, the outer outline 64 of the air gap 30 is located further out than the outer outline 60 of the resonance region 50. In the sample E, the outer outline of the lower piezoelectric film 14a and the outer outline of the upper piezoelectric film 14b are located further out than the outer outline 64 of the air gap 30. An outer outline 76 of the insertion film 28 is located further in than the outer outline 64 of the air gap 30 and further out than the outer outline 60 of the resonance region 50. The distance between the outer outline 60 of the resonance region 50 and the outer outline 76 of the insertion film 28 is a distance W8. As illustrated in FIG. 13B, in the sample e, the insertion film 28 is not located. Other configurations are the same as those of the sample E, and thus the description is omitted.

Figure 14A:
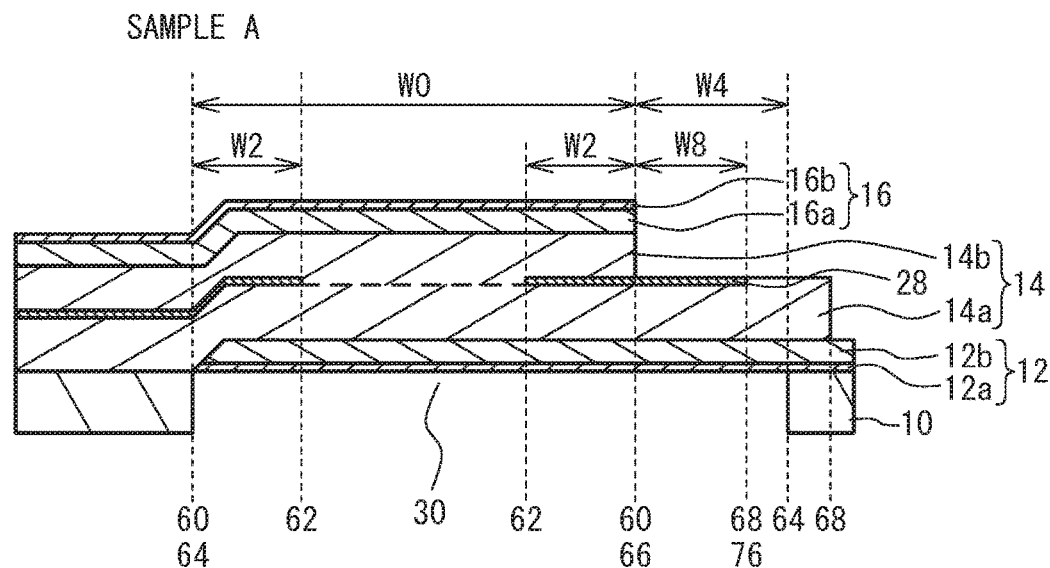
FIG. 14A and FIG. 14B are cross-sectional views of samples A and B as the embodiment, respectively.
Figure 14B:
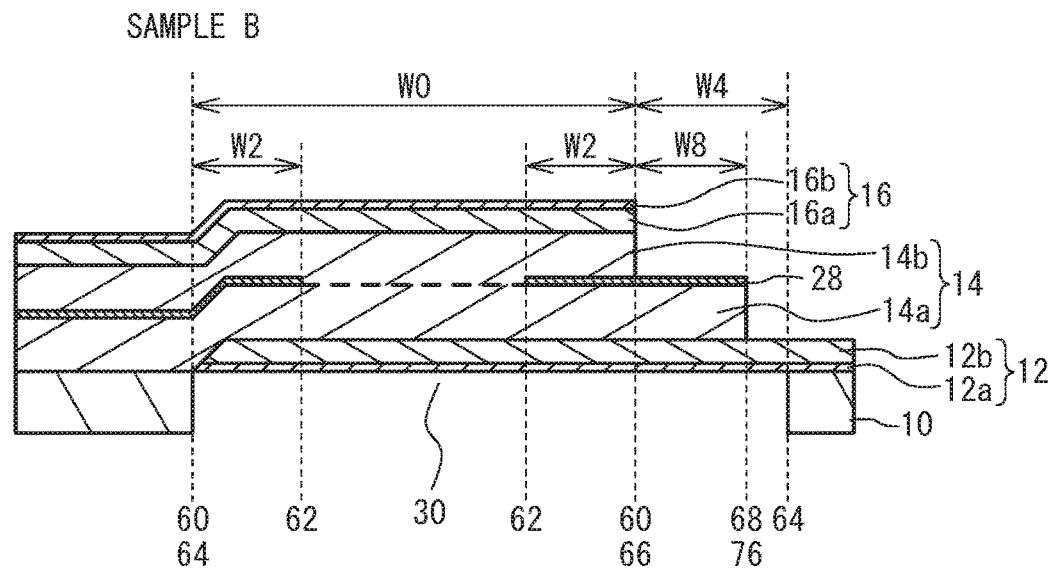

FIG. 14A and FIG. 14B are cross-sectional views of the samples A and B representing the embodiment, respectively. As illustrated in FIG. 14A, in the sample A, the outer outline 66 of the upper piezoelectric film 14b coincides with the outer outline 60 of the resonance region 50. Other configurations are the same as those of the sample E, and thus description is omitted. As illustrated in FIG. 14B, in the sample B, the outer outline 68 of the lower piezoelectric film 14a coincides with the outer outline 76 of the insertion film 28. Other configurations are the same as those of the sample A, and thus the description is omitted.

Figure 15A:
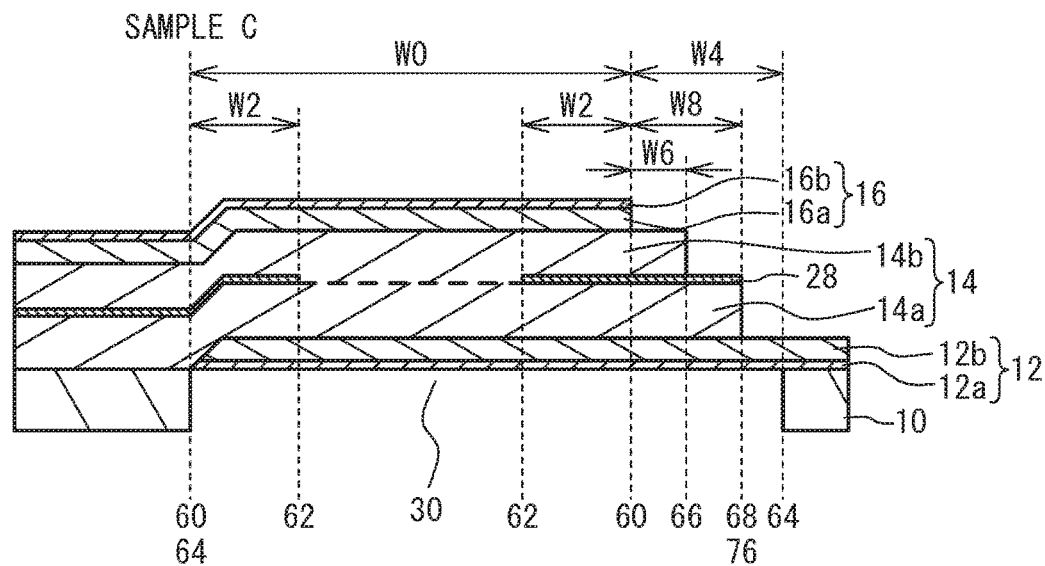
FIG. 15A and FIG. 15B are cross-sectional views of samples C and D as the embodiment, respectively.
Figure 15B:
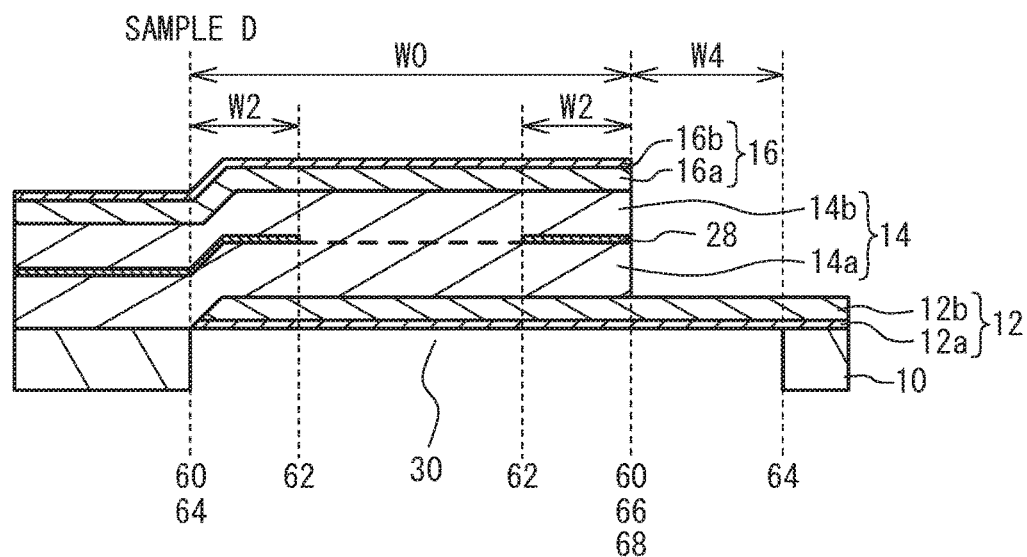

FIG. 15A and FIG. 15B are cross-sectional views of the samples C and D representing the embodiment, respectively. As illustrated in FIG. 15A, in the sample C, the outer outline 66 of the upper piezoelectric film 14b is located further out than the outer outline 60 of the resonance region 50 and further in than the outer outline 68 of the lower piezoelectric film 14a. The distance between the outer outline 60 of the resonance region 50 and the outer outline 66 of the upper piezoelectric film 14b is a distance W6. Other configurations are the same as those of the sample B, and thus the description is omitted. As illustrated in FIG. 15B, in the sample D, the outer outline 68 of the lower piezoelectric film 14a, the outer outline 76 of the insertion film 28, and the outer outline 66 of the upper piezoelectric film 14b coincide with the outer outline 60 of the resonance region 50. Other configurations are the same as those of the sample A, and the description is omitted.

Figure 16A:
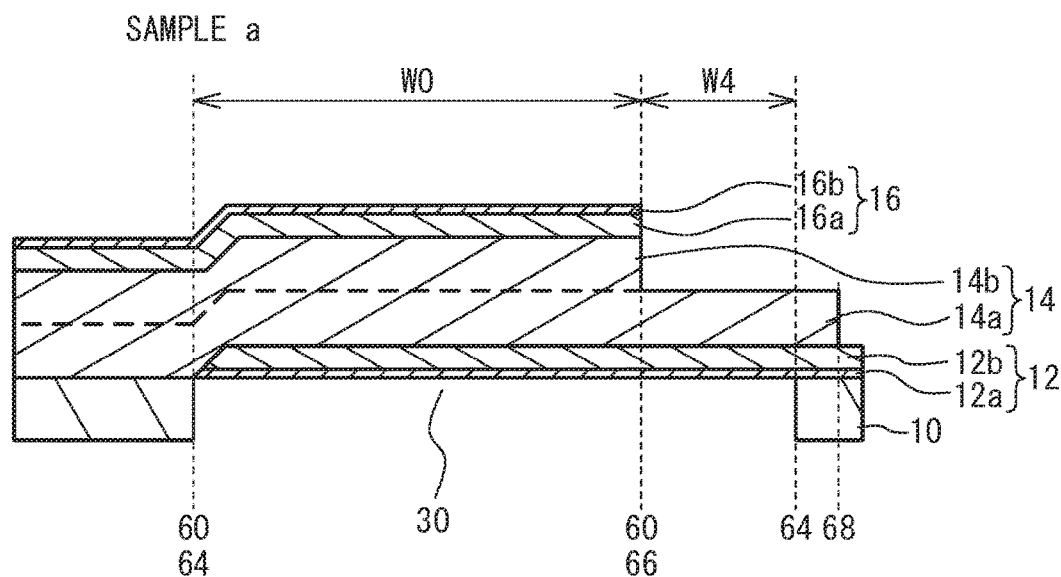
FIG. 16A and FIG. 16B are cross-sectional views of samples a and b as the comparative examples, respectively.
Figure 16B:
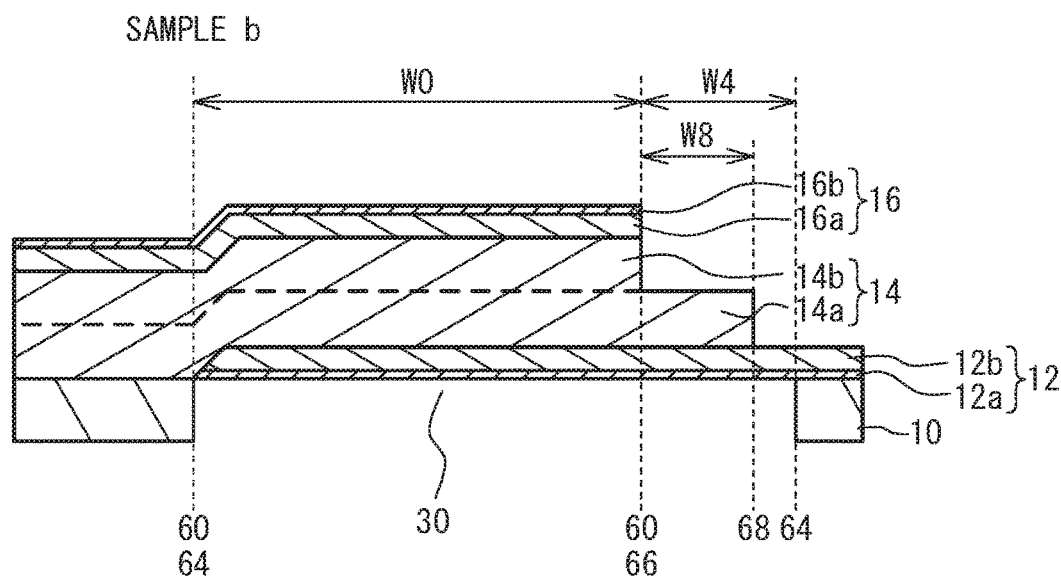

FIG. 16A and FIG. 16B are cross-sectional views of the samples a and b representing the comparative example, respectively. As illustrated in FIG. 16A and FIG. 16B, in the samples a and b, the insertion film 28 is not located. Other configurations of the samples a and b are the same as those of the samples A and B, respectively, and the description is omitted.

Figure 17A:
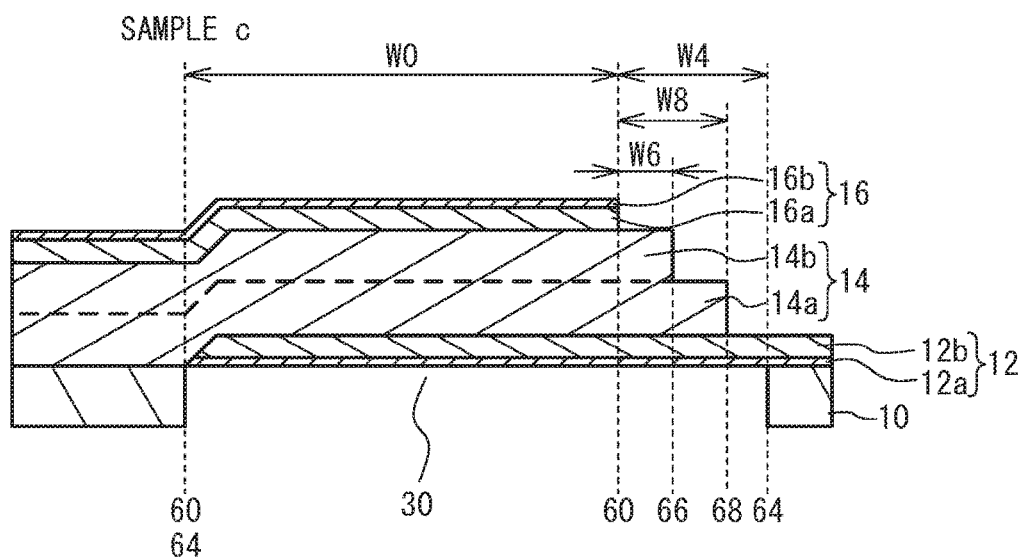
FIG. 17A and FIG. 17B are cross-sectional views of samples c and d as the comparative examples, respectively.
Figure 17B:
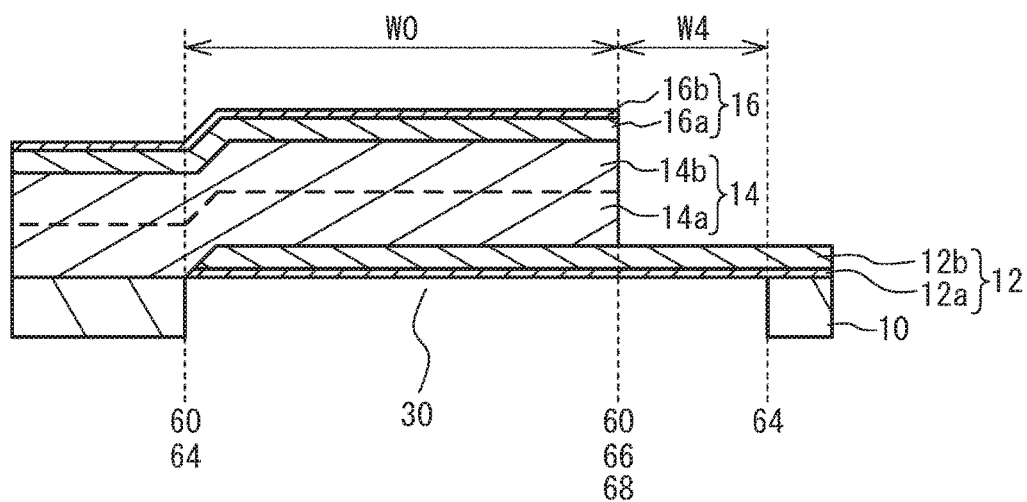

FIG. 17A and FIG. 17B are cross-sectional views of the samples c and d representing the comparative example, respectively. As illustrated in FIG. 17A and FIG. 17B, in the sample c and d, the insertion film 28 is not located. Other configurations of the samples c and d are the same as those of the samples C and D, respectively, and thus the description is omitted.

Figure 18:
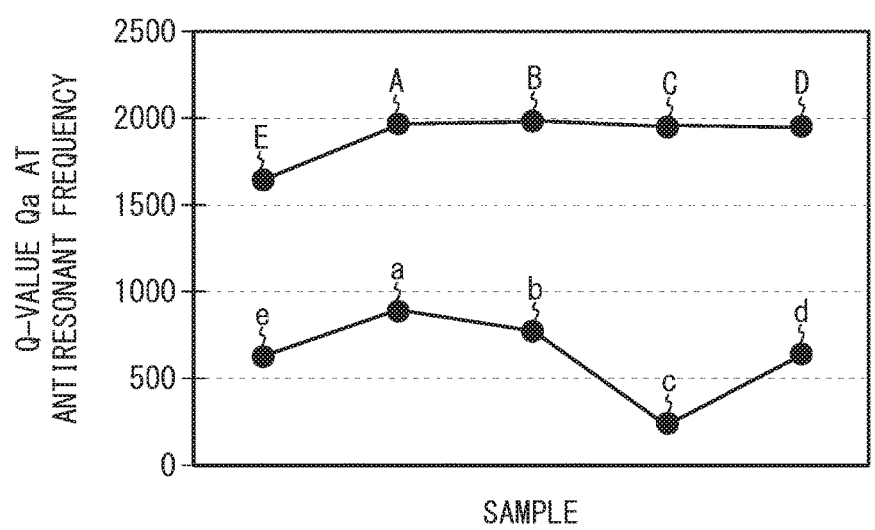
FIG. 18 illustrates a Q-value Qa at an antiresonant frequency in the samples A through E and a through e.

FIG. 18 illustrates a Q-value Qa at an antiresonant frequency in the samples A through E and a through e. As illustrated in FIG. 18, the Qa of the samples A through E in which the insertion film 28 is located is greater than the Qa of the samples a through e in which the insertion film 28 is not located. In the samples in which the insertion film 28 is not located, the Qa of the sample a is greater than the Qa of the sample e. The Qa of the samples b and d are approximately equal to the Qa of the sample e. The Qa of the sample c is less than the Qa of the sample e. In contrast, in the samples in which the insertion film 28 is located, the Qa of the samples A through D are improved compared to the Qa of the sample E. The Qa is approximately the same among the samples A through D.

Consider the samples in which the insertion film 28 is located. As revealed by the comparison between the samples E and e, the provision of the insertion film 28 causes the acoustic wave propagating from the resonance region 50 in the lateral direction to be reflected by the insertion film 28 (between the inner outline 62 of the insertion film 28 and the outer outline 60 of the resonance region 50). Accordingly, the leak of the acoustic wave energy is reduced. However, as in the sample E, when the end face of the piezoelectric film 14 is located further out than the outer outline 64 of the air gap 30 or the outer outline 64 of the acoustic mirror 31, the acoustic wave that has not been reflected by the insertion film 28 leaks to the substrate 10 through the piezoelectric film 14. Thus, as in the samples A through D, in at least a part of the region surrounding the resonance region 50, at least a part of the end face of the piezoelectric film 14 in the film thickness direction is made to be located between the outer outline 60 of the resonance region 50 and the outer outline 64 of the acoustic mirror 31 or the outer outline 64 of the air gap 30. This configuration causes the acoustic wave that has not been reflected by the insertion film 28 to be reflected by the end face of the piezoelectric film 14 located between the outer outline 60 of the resonance region 50 and the outer outline 64 of the air gap 30 or the outer outline 64 of the acoustic mirror 31. As described above, the acoustic wave propagating in the lateral direction is reflected at at least two points including the insertion film 28. Therefore, the acoustic wave propagating in the lateral direction can be inhibited from leaking to the substrate 10, and the resonance characteristics including a Q-value can be inhibited from deteriorating.

In contrast, as in the samples a through d, when the insertion film 28 is not located, the Q-value varies depending on the position of the end face of the piezoelectric film 14. This cause is not clear, but is considered to be because the reflection of the acoustic wave changes depending on the position of the end face of the piezoelectric film 14 when the acoustic wave propagating in the lateral direction is not reflected by the insertion film 28. As described above, when the insertion film 28 is not located, even though at least a part of the end face of the piezoelectric film 14 is located between the outer outline 60 of the resonance region 50 and the outer outline 64 of the air gap 30 or the outer outline 64 of the acoustic mirror 31, the degree of the improvement of the Q-value is limited. Furthermore, if the position of the end face of the piezoelectric film 14 varies in the fabrication process, the Q-value varies.

In addition, as in the samples A through D, in at least a part of the region surrounding the resonance region 50, the end face of the upper piezoelectric film 14b is located between the outer outline 60 of the resonance region 50 and the outer outline 64 of the air gap 30 or the outer outline 64 of the acoustic mirror 31. This configuration can stably improve the resonance characteristics including a Q-value. The outer outline 66 of the upper piezoelectric film 14b may be located further out than the outer outline 64 of the air gap 30 or the outer outline 64 of the acoustic mirror 31, and the end face of the lower piezoelectric film 14a may be located between the outer outline 60 of the resonance region 50 and the outer outline 64 of the air gap 30 or the outer outline 64 of the acoustic mirror 31.

Furthermore, as in the samples B through D, in at least a part of the region surrounding the resonance region 50, the end face of the lower piezoelectric film 14a is located further out than the end face of the upper piezoelectric film 14b and further in than the outer outline 64 of the air gap 30 or the outer outline 64 of the acoustic mirror 31. When the lower piezoelectric film 14a is located further out than the outer outline 64 of the air gap 30 or the outer outline 64 of the acoustic mirror 31 as in the sample A, the piezoelectric film 14 may exfoliate by stress. To prevent the exfoliation, it may be considered to provide the end face of the lower piezoelectric film 14a above the air gap 30. However, when the insertion film 28 is not located, as with the Q-values of the samples b through d, the Q-value deteriorates compared to that of the sample a. In contrast, when the insertion film 28 is located, as with the Q-values of the samples B through D, the Q-value can be made to be approximately equal to the Q-value of the sample A.

In at least a part of the region surrounding the resonance region 50, the end face of the insertion film 28 substantially coincides with the end face of the lower piezoelectric film 14a. As described above, the lower piezoelectric film 14a can be etched by using the insertion film 28 as a mask.

In at least a part of the region surrounding the resonance region 50, the end face of the upper piezoelectric film 14b is located further out than the outer outline 60 of the resonance region 50. To leave a margin for variations in the fabrication process, it may be considered to make the end face of the upper piezoelectric film 14b located further out than the outer outline 60 of the resonance region 50. However, when the insertion film 28 is not located, as with the Q-value of the sample c, the Q-value deteriorates compared to the Q-value of the sample a. In contrast, when the insertion film 28 is located, as with the Q-value of the sample C, the Q-value can be made to be approximately equal to the Q-value of the sample A.

In at least a part of the region surrounding the resonance region 50, the end faces of the upper piezoelectric film 14b, the insertion film 28, and the lower piezoelectric film 14a substantially coincide with each other. To simplify the fabrication process, it may be considered to etch the piezoelectric film 14 and the insertion film 28 by using the same mask. However, when the insertion film 28 is not located, as with the Q-value of the sample d, the Q-value deteriorates compared to the Q-value of the sample a. In contrast, when the insertion film 28 is located, as with the Q-value of the sample D, the Q-value can be made to be approximately equal to the Q-value of the sample A.

As the air gap 30, an air space containing the air can be used. The air space allows the acoustic wave propagating through the piezoelectric film 14 in the longitudinal direction to be efficiently reflected.

The air gap 30 of the first embodiment and the variations thereof may be substituted by the acoustic mirror 31. The acoustic mirror 31 can efficiently reflect the acoustic wave propagating through the piezoelectric film 14.

Third Embodiment

Figure 19A:
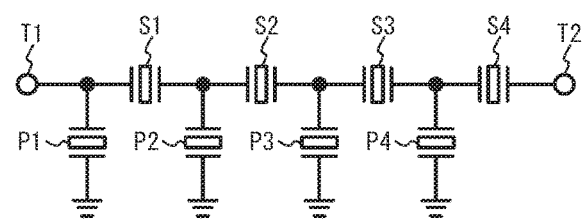
FIG. 19A is a circuit diagram of a filter in accordance with a third embodiment.

A third embodiment is an exemplary filter and an exemplary duplexer using the piezoelectric thin film resonator according to any one of the first and second embodiments and the variations thereof. FIG. 19A is a circuit diagram of a filter in accordance with a third embodiment. As illustrated in FIG. 19A, between an input terminal T1 and an output terminal T2, one or more series resonators S1 through S4 are connected in series. Between the input terminal T1 and the output terminal T2, one or more parallel resonators P1 through P4 are connected in parallel. At least one of one or more series resonators S1 through S4 or one or more parallel resonators P1 through P4 may use the acoustic wave resonator in accordance with any one of the first and second embodiments and the variations thereof. The number of resonators in a ladder-type filter can be appropriately selected. The filter including the acoustic wave resonator in accordance with any one of the first and second embodiments and the variations thereof may be a multimode filter instead of a ladder-type filter.

Figure 19B:
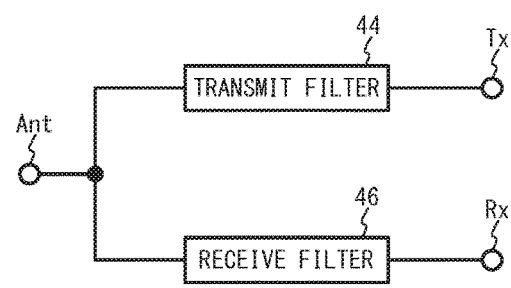
FIG. 19B is a circuit diagram of a duplexer in accordance with a variation of the ninth embodiment.

FIG. 19B is a circuit diagram of a duplexer in accordance with a variation of the third embodiment. As illustrated in FIG. 19B, between a common terminal Ant and a transmit terminal Tx, a transmit filter 44 is connected. Between the common terminal Ant and a receive terminal Rx, a receive filter 46 is connected. The transmit filter 44 transmits signals in the transmit band to the common terminal Ant as transmission signals among signals input from the transmit terminal Tx, and suppresses signals with other frequencies. The receive filter 46 transmits signals in the receive band to the receive terminal Rx as reception signals among signals input from the common terminal Ant, and suppresses signals with other frequencies. At least one of the transmit filter 44 or the receive filter 46 may be the filter of the third embodiment.

The filter includes the piezoelectric thin film resonator according to any one of the first and second embodiments and the variations thereof. This configuration improves the Q-value of the resonator, and can improve the skirt characteristic of the filter.

In addition, at least one of the transmit filter 44 or the receive filter 46 may be the filter including the piezoelectric thin film resonator according to any one of the first and second embodiments and the variations thereof.

Fourth Embodiment

Figure 20A:
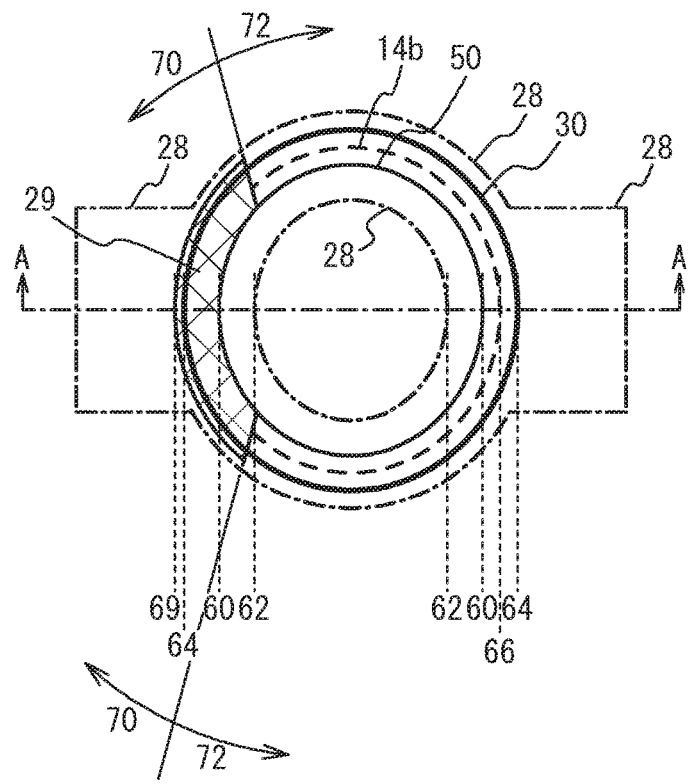
FIG. 20A is a plan view illustrating a positional relationship among the resonance region, the insertion film, the air gap, the piezoelectric film, and a support film around the resonance region of a piezoelectric thin film resonator in accordance with a fourth embodiment.
Figure 20B:
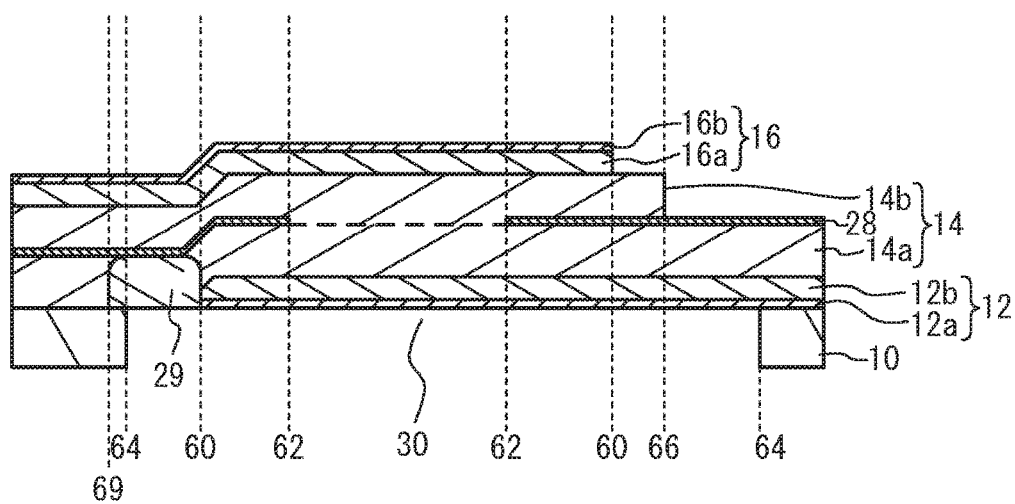
FIG. 20B is a cross-sectional view taken along line A-A in FIG. 20A.

FIG. 20A is a plan view illustrating a positional relationship among the resonance region, the insertion film, the air gap, the piezoelectric film, and a support film around the resonance region of a piezoelectric thin film resonator in accordance with a fourth embodiment. FIG. 20B is a cross-sectional view taken along line A-A in FIG. 20A. As illustrated in FIG. 20A and FIG. 20B, in the extraction region 70, the outer outline of the lower electrode 12 corresponding to the outer outline 60 of the resonance region 50 is located further in than the outer outline 64 of the air gap 30. A support film 29 is located in a region in which the lower electrode 12 does not exist above the air gap 30. The inner outline of the support film 29 makes contact with the lower electrode 12. An outer outline 69 of the support film 29 is located further out than the outer outline 64 of the air gap 30. The support film 29 is made of an insulating film such as, for example, a silicon oxide film or a silicon nitride film. The upper surface of the support film 29 makes contact with the insertion film 28. In the region 72 other than the extraction region 70, the insertion film 28 and the outer outline of the lower piezoelectric film 14a is located further out than the outer outline 64 of the air gap 30. Other configurations are the same as those of the second variation of the first embodiment, and thus the description is omitted.

In the fourth embodiment, to prevent the substrate 10 from restricting the vibration of the resonance region 50, the resonance region 50 is made to be smaller than the air gap 30 in plan view. In the extraction region 70, the outer outline 60 of the resonance region 50 is defined by the lower electrode 12. Thus, in the extraction region 70, the outer outline of the lower electrode 12 is located further in than the air gap 30. As described above, when a part of the outer outline of the lower electrode 12 is located further in than the air gap 30, the piezoelectric film 14 may not be supported. To address this problem, the support film 29 supporting the piezoelectric film 14 is provided. The inner side of the support film 29 preferably makes contact with the lower electrode 12, and the outer outline 69 of the support film 29 is preferably located further out than the air gap 30. This configuration allows the support film 29 to support the piezoelectric film 14. In addition, the upper surface of the support film 29 preferably makes contact with the insertion film 28. The insertion film 28 is stronger than the piezoelectric film 14, and the support film 29 thus can support the piezoelectric film 14 through the insertion film 28.

In the first through third embodiments and the variations thereof, the support film may be located as in the fourth embodiment.

Although the embodiments of the present invention have been described in detail, it is to be understood that the various change, substitutions, and alterations could be made hereto without departing from the spirit and scope of the invention.

What is claimed is:

1. A piezoelectric thin film resonator comprising:
   a substrate;
   an acoustic reflection layer that includes an air gap, or an acoustic mirror in which at least two types of layers with different acoustic characteristics are stacked;
   a lower electrode and an upper electrode that face each other in a stacking direction, at least a part of the lower electrode and at least a part of the upper electrode being located on or above the acoustic reflection layer;
   a piezoelectric film that is sandwiched between the lower electrode and the upper electrode and includes a lower piezoelectric film and an upper piezoelectric film, an end face of the upper piezoelectric film being located further out than an outer outline of a resonance region, in which the lower electrode and the upper electrode face each other across the piezoelectric film, and further in than an outer outline of the acoustic reflection layer in at least a part of a region surrounding the resonance region, the outer outline of the acoustic reflection layer being located further out than the outer outline of the resonance region; and
   an insertion film that is inserted between the lower piezoelectric film and the upper piezoelectric film, is located in at least a part of an outer peripheral region within the resonance region, and is not located in a center region of the resonance region.

2. The piezoelectric thin film resonator according to claim 1, wherein
   in the at least a part of the region surrounding the resonance region, an end face of the lower piezoelectric film is located further out than the end face of the upper piezoelectric film and further in than the outer outline of the acoustic reflection layer.

3. The piezoelectric thin film resonator according to claim 2, wherein
   in the at least a part of the region surrounding the resonance region, an end face of the insertion film substantially coincides with the end face of the lower piezoelectric film.

4. A filter comprising
   the piezoelectric thin film resonator according to claim 1.

5. A duplexer comprising
   a filter including the piezoelectric thin film resonator according to claim 1.

6. The piezoelectric thin film resonator according to claim 1, further comprising:
   an additional film that is located on the upper piezoelectric film, further out than the outer outline of the resonance region, and away from the upper electrode in the at least a part of the region surrounding the resonance region.

7. The piezoelectric thin film resonator according to claim 1, wherein in the at least a part of the region surrounding the resonance region, an end face of the lower piezoelectric film is located further out than the end face of the upper piezoelectric film.

8. The piezoelectric thin film resonator according to claim 1, wherein
an acoustic impedance of the insertion film is less than an acoustic impedance of the piezoelectric film.

9. The piezoelectric thin film resonator according to claim 1, wherein
the acoustic reflection layer includes an air space.

10. The piezoelectric thin film resonator according to claim 1, wherein
the acoustic reflection layer includes the acoustic mirror that reflects an acoustic wave propagating through the piezoelectric film.

11. The piezoelectric thin film resonator according to claim 1, wherein
the acoustic reflection layer includes the acoustic mirror, and
one of the at least two types of layers of the acoustic mirror is the substrate.

12. A piezoelectric thin film resonator comprising:
a substrate;
an acoustic reflection layer that includes an air gap, or an acoustic mirror in which at least two types of layers with different acoustic characteristics are stacked;
a lower electrode and an upper electrode that face each other in a stacking direction, at least a part of the lower electrode and at least a part of the upper electrode being located on or above the acoustic reflection layer;
a piezoelectric film that is sandwiched between the lower electrode and the upper electrode and includes a lower piezoelectric film and an upper piezoelectric film, an end face of the upper piezoelectric film being located further out than an outer outline of a resonance region, in which the lower electrode and the upper electrode face each other across the piezoelectric film, and further in than an outer outline of the acoustic reflection layer, at the outer outline of the resonance region, or at the outer outline of the acoustic reflection layer in at least a part of a region surrounding the resonance region, the outer outline of the acoustic reflection layer being located further out than the outer outline of the resonance region and an insertion film that is inserted between the lower piezoelectric film and the upper piezoelectric film, is located in at least a part of an outer peripheral region within the resonance region, and is not located in a center region of the resonance region, wherein
in the at least a part of the region surrounding the resonance region, end faces of the upper piezoelectric film, the insertion film, and the lower piezoelectric film substantially coincide with each other.

13. A filter comprising the piezoelectric thin film resonator according to claim 12.

14. A duplexer comprising a filter including the piezoelectric thin film resonator according to claim 12.

* * * * *